(12) United States Patent
Nishimura et al.

(10) Patent No.: US 11,011,457 B2
(45) Date of Patent: May 18, 2021

(54) WIRING SUBSTRATE

(71) Applicant: SHINKO ELECTRIC INDUSTRIES CO., LTD., Nagano (JP)

(72) Inventors: Koichi Nishimura, Nagano (JP); Noriyoshi Shimizu, Nagano (JP); Jun Furuichi, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 16/875,072

(22) Filed: May 15, 2020

(65) Prior Publication Data

US 2020/0373233 A1 Nov. 26, 2020

(30) Foreign Application Priority Data

May 22, 2019 (JP) .............................. JP2019-096419

(51) Int. Cl.
| | |
|---|---|
| *H05K 1/11* | (2006.01) |
| *H05K 1/02* | (2006.01) |
| *H05K 1/18* | (2006.01) |
| *H01L 23/498* | (2006.01) |
| *H01L 21/48* | (2006.01) |

(52) U.S. Cl.
CPC ...... *H01L 23/49822* (2013.01); *H01L 21/481* (2013.01); *H01L 21/486* (2013.01); *H01L 21/4857* (2013.01); *H01L 23/49838* (2013.01); *H05K 1/111* (2013.01); *H05K 1/112* (2013.01); *H05K 1/0284* (2013.01); *H05K 1/0298* (2013.01); *H05K 1/18* (2013.01)

(58) Field of Classification Search
CPC ........... H01L 23/49822; H01L 21/4857; H01L 21/486; H01L 21/481; H01L 23/49838; H01L 23/5385; H01L 23/49811; H01L 2221/68345; H01L 2221/68359; H01L 21/6835; H01L 2224/73204
See application file for complete search history.

(56) References Cited

U.S. PATENT DOCUMENTS

| | | | |
|---|---|---|---|
| 2010/0295191 A1 | 11/2010 | Kikuchi et al. | |
| 2011/0139502 A1* | 6/2011 | Kobayashi | H01L 24/16 174/261 |
| 2011/0198114 A1* | 8/2011 | Maeda | H01L 23/49811 174/257 |
| 2013/0328212 A1* | 12/2013 | Chino | H01L 21/568 257/774 |
| 2015/0009645 A1* | 1/2015 | Kaneko | H05K 1/181 361/767 |

FOREIGN PATENT DOCUMENTS

WO 2009/088000 7/2009

* cited by examiner

*Primary Examiner* — Ishwarbhai B Patel
(74) *Attorney, Agent, or Firm* — Rankin, Hill & Clark LLP

(57) ABSTRACT

A wiring substrate includes a first insulation layer containing insulating resin, a first through hole passing through the first insulation layer is the thickness direction, a pad formed within the first through hole, a second insulation layer containing insulating resin and laminated on a first surface of the first insulation layer, and a first wiring layer provided on the second insulation layer and connecting to the pad. A connecting surface of the pad that connects the first wiring layer includes a curved surface that curves in a protruding shape toward the first surface of the first insulation layer.

4 Claims, 21 Drawing Sheets ary and explanatory and are not restrictive of the invention, as claimed.

WIRING SUBSTRATE

CROSS-REFERENCE TO RELATED APPLICATION

This application is based upon and claims the benefit of priority of the prior Japanese Patent Application. No. 2019-096419, filed on May 22, 2019, the entire contents of which are incorporated herein by reference.

FIELD

The embodiments discussed herein are related to a wiring substrate and a method for manufacturing a wiring substrate.

BACKGROUND

Wiring substrates with laminations (or multiple layers) of alternately arranged insulation layers of insulating resin and wiring layers of metal are known in the art. In these types of wiring substrates, for example, metal pads coupled to wiring layers over another insulation layers are embedded into the insulation layer that is positioned on the lowest layer. The pads embedded into the insulation layer are for example utilized as external connector terminals when bonding wiring substrates to other wiring substrates.

Pads are formed for example in the through holes in a reverse truncated cone shape formed in the insulation layer. Pads are formed for example by an electroplating method. The upper surface of the pad is electrically connected to a wiring layer on another insulation layer, by way of a via formed in another insulation layer installed adjacently above the insulation layer. The lower surface of the pad is exposed from the insulation layer and is electrically connected to another wiring substrate. A related technique is described in WO 2009-088000, for example.

However, when the inner wall surfaces of the through hole of the insulation layer, where the pad is formed, are formed in a linear shape, the upper surface of the pad includes a planar surface that is approximately parallel to the bottom of the through hole and is an inclined (or sloped) plane that extends to the inner wall surface of the through hole from the outer end of the planar surface toward the lower surface side of the pad. The upper surface of the pad therefore includes a corner at the boundary between the planar surface and the inclined plane.

When a via connects to the upper surface of the pad (wiring layer) including the corner in this way, an internal stress concentrates at the portion connecting the via wiring with the corner on the upper surface of the pad. For example, when bonding a wiring substrate to another wiring substrate, the stress that is applied to the pad from another wiring substrate concentrates at the portion connecting the via wiring to the corner of the upper surface of the pad. The possibility that the pad and via wiring will break consequently becomes high, causing the problem that the connection reliability between the pad and via wiring may deteriorate. Also, when contacting the corner of the pad with the insulation layer, stress concentrates at the corner so a crack may develop in the insulation layer with the corner as the start point.

SUMMARY

According to an aspect of an embodiment, a wiring substrate includes: a first insulation layer that contains insulating resin; a first through hole that passes through the first insulation layer in a thickness direction; a pad that is formed in the first through hole; a second insulation layer that is laminated on a first surface of the first insulation layer and contains insulating resin; and first wiring layer that is provided on the second insulation layer and connected to the pad. A connecting surface of the pad that connects to the first wiring layer includes a curved surface curving in a protruding shape toward the first surface of the first insulation layer.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
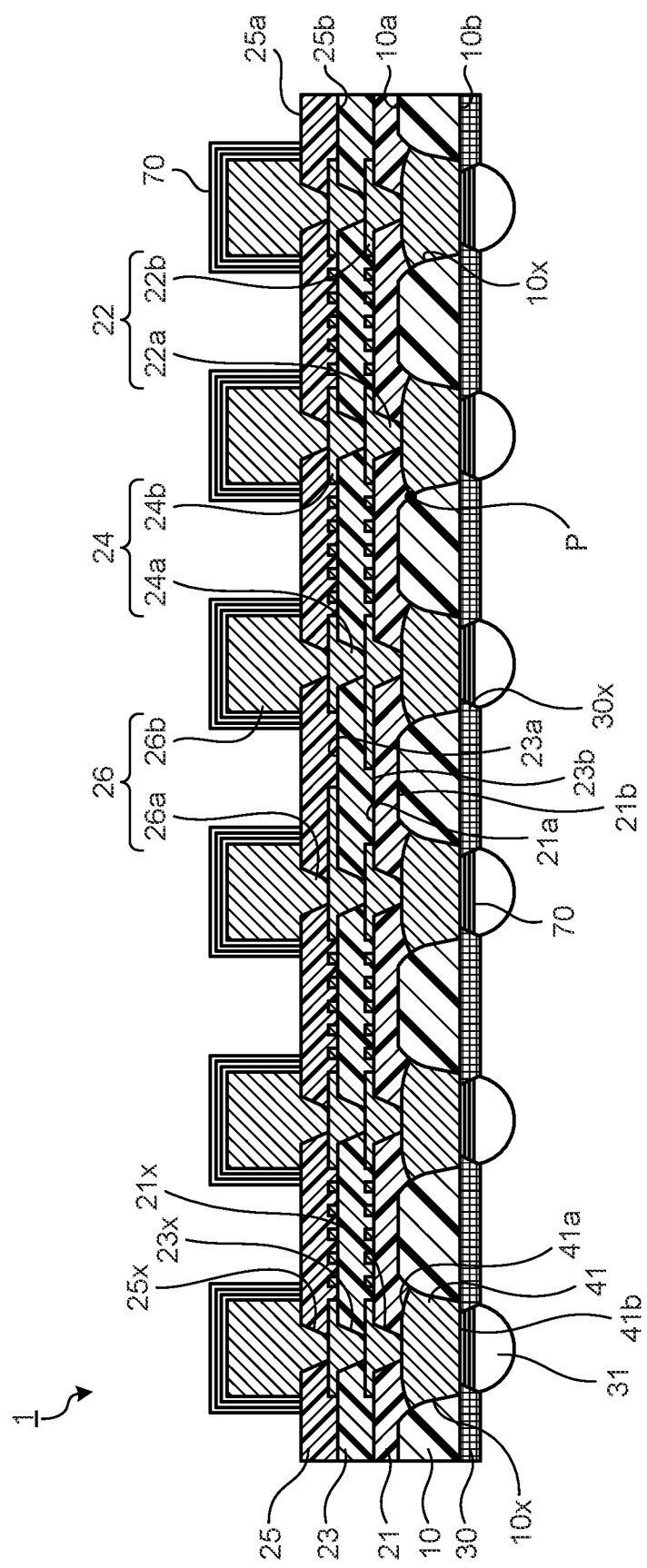
FIG. 1 is a drawing illustrating one example of the structure of a wiring substrate of a first embodiment.

The embodiments of the wiring substrate, and the wiring substrate manufacturing method disclosed in the present application are described next while referring to the drawings. The disclosed technology is not limited by these embodiments. The same reference numerals are applied to structures in the embodiments having identical functions and redundant descriptions are omitted.

First Embodiment

Structure of the Wiring Substrate

FIG. 1 is a drawing illustrating one example of the structure of a wiring substrate 1 of a first embodiment. FIG. 1 is a schematic view illustrating a cross section of the wiring substrate 1.

The wiring substrate 1 has a laminated structure and mainly includes insulation layers 10, 21, 23, 25, a pad 41, wiring layers 22, 24, 26, a solder resist layer 30, and a surface treatment layer 70. The pad 41 is installed in the insulation layer 10. Hereafter, for purposes of simplifying the description, the surface of the wiring layer 26 side of the wiring substrate 1 is called the upper surface, and the surface or the solder resist layer 30 side is called the lower surface. However, the wiring substrate 1 may for example be utilized with the upper and lower sides reversed and optional position may be utilized.

The insulation layers 10, 21, 23, 25 are formed from insulating resin. Insulating resin that utilizes a photosensitive resin such as phenolic resin and polyimide resin as the main ingredient can for example be utilized as material of the insulation layers 10, 21, 23, 25. These insulation layers 10, 21, 23, 25 may for example include filler such as silica or alumina. A pad 41 and the wiring layers 22, 24, and 26 may for example utilize copper as the material.

A through hole 10x is formed as an opening at the necessary positions on an upper surface 10a of the insulation layer 10 to pass through the insulation layer 10 in the thickness direction. In FIG. 1, the through hole 10x is formed in a taper shape with a diameter that becomes gradually smaller from the upper surface 10a toward a lower surface 10b. For example, the through hole 10x is formed in an approximately reverse truncated cone shape with an opening diameter at the opening, end on the lower surface 10b side that is smaller than the opening diameter at the opening end on the upper surface 10a side. The opening diameter at the opening end on the upper surface 10a side of the through hole 10x for example can be set to approximately 50 to 110 µm, and the opening diameter at the opening end on the lower surface 10b side of the through hole 10x can be set to a diameter of approximately 40 to 100 µm. The thickness of the insulation layer 10 can be set for example to approximately 8 to 14 µm. In the example of the present embodiment, the inner wall surface of the through hole 10x is formed in a curved surface curving in a protrusion toward the interior of the opening of the through hole 10x.

The pad 41 for example is a terminal utilized as an external connector terminal for the other wiring substrates. The pad 41 is formed inside the through hole 10x. An upper surface 41a of the pad 41 is a connecting surface that connects to a via wiring 22a of the wiring layer 22. A lower surface 41b of the pad 41 is exposed from the lower surface 10b of the insulation layer 10 and is a connecting surface that connects to other wiring substrates. The upper surface 41a of the pad 41 is exposed from the upper surface 10a of the insulation layer 10 and also includes a curved surface curving in a protrusion toward the upper surface 10a of the insulation layer 10. The outer edge of the upper surface 1a of the pad 41 contacts the inner wall surface of the through hole 10x at a position lower than the upper surface 10a of the insulation layer 10 (contact point P). In the present embodiment, the inner wall surface of the through hole 10x is formed in a curved surface curving in a protrusion toward the interior of the opening of the through hole 10x. The upper surface 41a of the pad 41 is formed in a curved surface shape (convex curved surface) bulging upward toward the upper surface 10a of the insulation layer 10 according to the inner wall surface of the through hole 10x. The thickness from the lower surface 41b of the pad 41 to the center (peak) of the upper surface 41a can for example be set to approximately 8 to 11 µm. The thickness of the pad 41 can be made thinner than the thickness of the insulation layer 10 or can even be the same thickness. The contact point P with the inner wall surface of the through hole 10x and the outer edge of the upper surface 41a of the pad 41 is at a position lower than the upper surface 10a of the insulation layer 10 even if the thickness of the pad 41 is thinner than the thickness of the insulation layer 10, or even if the thickness of the pad 41 has the same thickness as the insulation layer 10. The upper surface 41a of the pad 41 is a curved surface with a continuous bulge from the center (peak of bulge) to the outer edge (contact point P with the inner wall surface of the through hole 10x). Only the upper surface 41a of the pad 41 is formed as a protruding (bulging) curved surface. The lower surface 41b of the pad 41 is formed to be flush with the lower surface 10b of the insulation layer 10. The lower surface 41b of the pad 41 may be formed for example retracted (receding inwards) at the upper surface 10a side more than the lower surface 10b of the insulation layer 10 (See FIG. 21). Restated in other words, in FIG. 1, the lower surface 41b of the pad 41 may also be positioned on the upper surface 10a side rather than the lower surface 10b of the insulation layer 10. The pitch of the pad 41 may for example be set to approximately 70 to 300 µm.

The insulation layer 21 is formed on the upper surface 10a of the insulation layer 10 so as to cover the upper surface 41a of the pad 41. The insulation layer 21 fills the inside of the opening of the through hole 10x of the insulation layer 10. The insulation layer 21 is an insulation layer thinner than the insulation layer 10. A through hole 21x passing through the insulation layer 21 in the thickness direction is formed at a position corresponding to the position of the upper surface 41a of the pad 41, to expose a portion of the upper surface of the pad 41. The thickness or the insulation layer 21 can for example be set to approximately 2 to 6 µm. In FIG. 1, the through hole 21x is formed in a taper shape with a diameter that becomes gradually smaller from an upper surface 21a toward a lower surface 21b. For example, the through hole 21x is formed in an approximately reverse truncated cone shape and an opening diameter at the opening end on the lower surface 21b side is smaller than the opening diameter at the opening end on the upper surface 21a side. The opening diameter at the opening end on the upper surface 21a side of the through hole 21x for example can be set to a diameter of approximately 5 to 10 µm.

The wiring layer 22 formed on the insulation layer 21. The wiring layer 22 includes the via wiring 22a filling the inside of the through hole 21x, and a wiring pattern 22b formed on the upper surface 21a of the insulation layer 21. The lower end surface of the via wiring 22a is directly connected to a portion of the upper surface 41a of the pad 41. The thickness of the wiring layer 22 can be set for example from to 1 to 5 μm. The wire width and the wire spacing of the layer 22 are smaller than the wire width and the wire spacing of the pad 1 within the insulation layer 10. The line-and-space (L/S) of the wiring layer 22 can for example to be approximately 2 μm/2 μm to 3 μm/3 μm.

The insulation layer 23 is formed on the upper surface 21a of the insulation layer 21 so as to cover the wiring layer 22. A through hole 23x is formed passing through the insulation layer 23 in the thickness direction and exposing a portion of the upper surface of the wiring pattern 22b of the wiring layer 22 in the insulation layer 23. The through hole 23x in FIG. 1 is formed in a taper shape with a diameter that becomes gradually smaller from an upper surface 23a toward a lower surface 23b. The through hole 23x for example is formed in an approximately reverse truncated cone shape with an opening diameter at the opening end on the lower surface 23b side that is smaller than the opening diameter at the opening end on the upper surface 23a side. The thickness of the insulation layer 23 and the opening diameter of the through hole 23x can for example be set the same as the insulation layer 21.

The wiring layer 24 formed on the insulation layer 23. The wiring layer 24 includes a via wiring 24a filled in the interior of the through hole 23x, and a wring pattern 24b formed on the upper surface 23a of the insulation layer 23. The lower end surface of the via wiring 24a connects directly to a portion of the wiring pattern 22b of the wiring layer 22. The thickness and the line-and-space (L/S) of the wring layer 24 can for example be the same as the wiring layer 22.

The insulation layer 25 is formed on the upper surface 23a of the insulation layer 23 so as to cover the wiring layer 24. A through hole 25x is formed passing through the insulation layer 25 in the thickness direction and exposing a portion of the upper surface of the wiring pattern 24b of the wiring layer 24 in the insulation layer 25. The through hole 25x in FIG. 1 is formed in a taper shape with a diameter that gradually narrows from an upper surface 25a toward a lower surface 25b. The through hole 25x for example is formed in an approximately reverse truncated cone shape with an opening diameter at the opening end on the lower surface 25b side that is smaller than the opening diameter at the opening end on the upper surface 25a side. The thickness and the opening diameter of the through hole 25x of the insulation layer 25 can for example be set the same as the insulation layer 21.

The wiring layer 26 is formed on the insulation layer 25. The wiring layer 26 includes a via wiring 26a filled in the interior of the through hole 25x, and a wiring pattern 26b formed on the upper surface 25a of the insulation layer 25. The lower surface of the via wiring 26a connects directly to a portion of the wiring pattern 24b of the wiring layer 24. The wiring pattern 26b protrudes upward from the upper surface 25a of the insulation layer 25. The wiring pattern 26b is for example a pillar-shaped connecting terminal (metal post). The planar shape of the wiring pattern 26b can be set to an optional shape and an optional size. For example, the planar shape or the wiring pattern 26b can be set to a circular shape with a diameter of approximately 20 to 25 μm. The pitch of the wiring pattern 26b can be set to approximately 40 to 50 μm. This wiring pattern 26b functions as a terminal for mounting electronic components for electrically connecting electronic components such as semiconductor chips.

The solder resist layer 30 is a protective layer that covers a portion of the lower surface 41b of the pad 41 and the lower surface 10b of the insulation layer 10 and protects the pad 41 and the lower surface 10b of the insulation layer 10. An opening 30x for exposing a portion of the lower surface 41b of the pad 41 is formed in the solder resist layer 30. Photosensitive insulating resin utilizing phenol resin and polyimide resin as the main ingredient can be utilized as the material for the solder resist layer. The solder resist layer 30 may for example include filler such as silica or alumina. The thickness of the solder resist layer 30 may for example be set to approximately 15 to 25 μm. The solder resist layer 30 is formed in the wiring substrate of the first embodiment however it need not be formed unless needed and may for example utilize the shape in FIG. 13. The opening 30x and the planar shape of the lower surface 41b of the pad 41 can be set to an optional shape and an optional size. For example, the opening 30x and the planar shape of the lower surface 41b of the pad 41 can be set to a circular shape with a diameter of approximately 30 to 90 μm.

If needed, the surface treatment layer 70 may be formed on the surface (upper surface and side surface, or only the upper surface) of the wiring pattern. 26b and on the lower surface 41b of the pad 41 that is exposed from the opening 30x. An example of the surface treatment layer 70 may utilize an OSP film that is formed by anti-oxidation processing such as organic solderability preservative (OSP) processing. An organic film such as azole compound or imidazole compound may be utilized as the OSP film. Other examples that are given for the surface treatment layer include a Cold (Au) layer, a nickel (Ni) layer/Au layer (metal layer laminated in the order of a Ni layer and a Au layer), and a Ni layer/palladium (Pd) layer/Au layer (metal layer laminated in the order of a Ni layer, a Pd layer, and a Au layer). Here, Au layer is a metal layer including Au or a Au alloy, the Ni layer is a metal layer of Ni or a Ni alloy, the Pd layer is a metal layer of Pd or a Pd alloy. The Ni layer, Au layer, or Pd layer can for example utilize a metal layer formed by an electroless plating method (electroless plating metal layer). FIG. 1 illustrates a surface treatment layer 70 of Ni layer/palladium (Pd) layer/Au surface treatment layer 70 is formed in the wiring substrate according to the first embodiment however it need not be formed unless needed.

A burp 31 for joining the pad 41 to pads on other wiring substrates is formed by way of the surface treatment layer 70, on the lower surface 41b of the pad 41 exposed by way of the opening 30x. The bump 31 can for example utilize tin (Sn) layer or solder plating of lead (Pb)-free solder. The material for the solder plating may utilize lead-free solder that Sn-silver (Ag) based, Sn—Cu based, or Sn—Ag—Cu based, for example.

The upper surface 41a of the pad 41 can be a curved surface curving in a protrusion (bulge). No corners therefore are formed on the upper surface 41a of the pad 41. A concentrated stress at the portion connecting the via wiring 22a with the upper surface 41a of the pad 41 can therefore be alleviated even when stress is applied to the pad 41 serving as the external connector terminal from another wiring substrate when the wiring substrate 1 is joined to another wiring substrate. The fracturing of the pad 41 and the via wiring 22a can consequently be suppressed, and the connection reliability of the wiring layer 22 by way of the pad 41 and the via wiring 22a can be improved.

Semiconductor Device Structure

Figure 2:
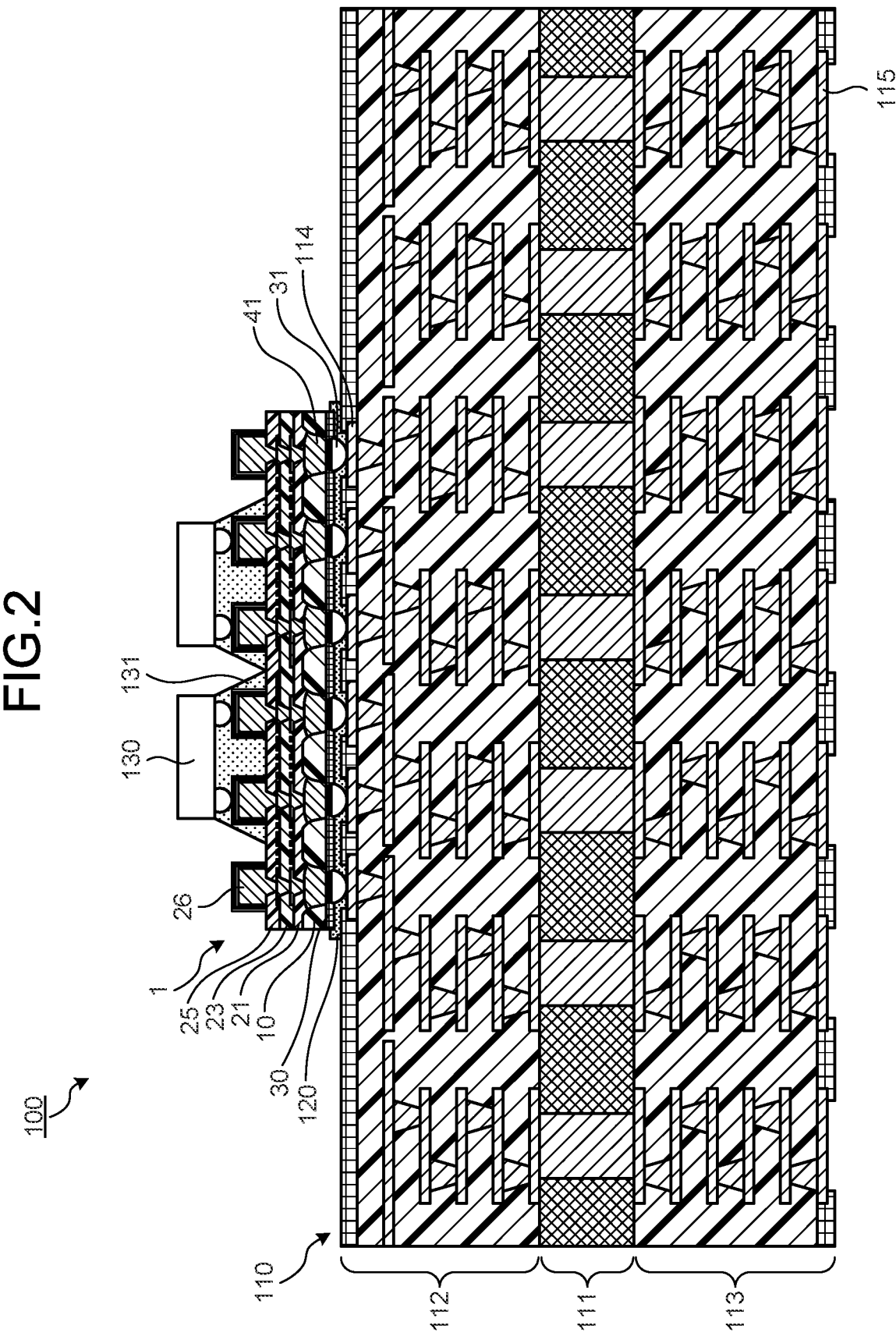
FIG. 2 is a drawing illustrating one example of the structure of a semiconductor device manufactured by utilizing the wiring substrate of the first embodiment.

FIG. 2 is a drawing illustrating one example of the structure of a semiconductor device 100 manufactured by utilizing the wiring substrate 1 of the first embodiment. FIG. 2 schematically illustrates a cross section of the semiconductor device 100.

As illustrated in FIG. 2, the semiconductor device 100 includes a wring substrate 110, a wiring substrate 1, and a semiconductor chip 130.

The wiring substrate 110 is a laminate (layered) structure that includes mainly a core layer 111, a build-up layer 112 laminated on the upper surface of the core layer 111, and a build-up layer 113 laminated on the lower surface of the core layer 111. A pad 114 is formed on the upper surface of the build-up layer 112, and a pad 115 is formed on the lower surface of the build-up layer 113. The pad 114 is formed for example from a metal such as copper and is utilized as an external connector terminal when joining the wiring substrate 110 to the wiring substrate 1. The pad 115 is formed for example from a metal such as copper and is utilized as an external connector terminal when joining the wiring substrate 110 to an external board such as a mother board. Wiring is also formed electrically connecting the pad 114 and the pad 115 to internal portions of the core layer 111, internal portions of the build-up layer 112, and internal portions of the build-up layer 113. The wiring substrate 110 is not limited a wiring substrate with a core layer and may be a so-called careless wiring substrate with no core layer.

The wiring substrate 1 is mounted on the wiring substrate 110. In other words, along with joining the pad 41 of the wiring substrate 1 with the pad 114 of the wiring substrate 110 by way of the bumps 31, an adhesion layer 120 seals the gap between the wiring substrate 1 and the wiring substrate 110. A non-conductive film (NCF), an anisotropic conductive film (ACF), or an underfill resin is utilized as the adhesion layer 120, for example.

A logic chip such as a central processing unit (CPU) chip or a graphics processing unit (GPU) chip may for example be utilized as the semiconductor chip 130. A memory chip such as a dynamic random access memory (DRAM) chip, a static random access memory (SRAM) chip, or a flash memory chip may for example be utilized as the semiconductor chip 130. When mounting a plurality of semiconductor chips 130 on the wiring substrate 1, a combination of the memory chips and the logic chips may be mounted on the wiring substrate 1. The thickness of the semiconductor chip 130 may for example be set to approximately 50 to 100 μm. The semiconductor chip 130 is bonded by way of the solder bump to the wiring layer 26 (wiring pattern 26*b*) of the wiring substrate 1. Underfill resin 131 is then filled in between the semiconductor chip 130 and the wiring substrate 1, and the underfill resin 131 seals the gap between the wiring substrate 1 and the semiconductor chip 130.

Method for Manufacturing Wiring Substrate

The method for manufacturing the wiring substrate 1 of the first embodiment is described next.

Figure 3:
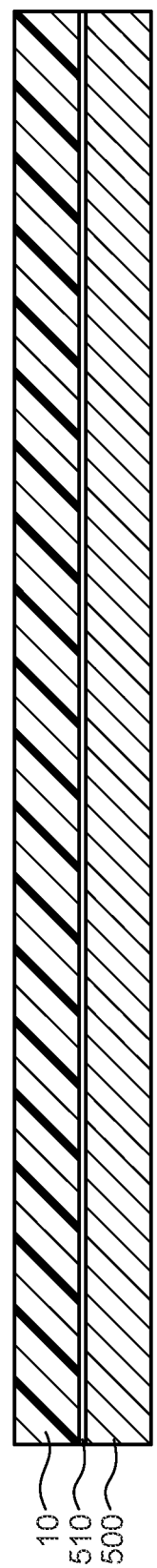
FIG. 3 is a drawing illustrating a specific example of a seed layer forming step and a first insulation layer forming step of the first embodiment.

First of all, as illustrated in FIG. 3, a seed layer 510 is formed on a support member 500, and the insulation layer 10 is formed on the seed layer 510 in a semi-cured state. Glass sheet, resin sheet with metal leaf, or metal plate may be utilized as the support member 500, for example. The seed layer 510 can for example be formed by utilizing the sputter method, the electroplating method, or a vapor deposition method. Conductive material that functions as the stopper layer during etching removal of the support member 500 can be utilized as the material for the seed layer 510. The material for the seed layer 510 can also utilize conductive material capable of selective etching removal on a pad 41 formed in a latter process. A metal such as titanium (Ti), nickel (Ni), chromium (Cr), tin (Sn), or an alloy including one metal type selected from among these metals can be utilized as the material for the seed layer 510. The material for the seed layer 510 in the present embodiment utilizes titanium (Ti). The thickness of the seed layer 510 may for example be set to approximately 10 to 50 nm. The method for forming the insulation layer 10 when utilizing resin film is to laminate a resin film on the upper surface of the seed layer 510 by thermocompression bonding. Another method for forming the insulation layer 10 is applying an insulation resin in liquid state or paste state on the upper surface of the seed layer 510 by spin coating or other method.

Figure 4:
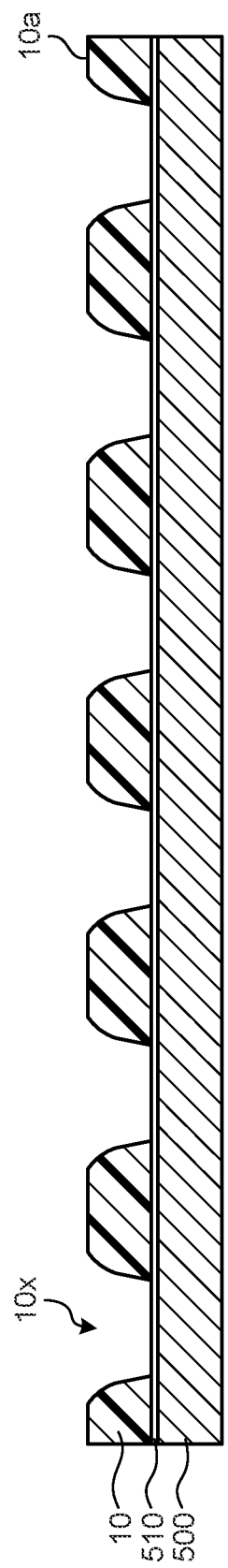
FIG. 4 is a drawing illustrating specific example of a through hole forming step of the first embodiment.

Next, as illustrated in FIG. 4, the through hole 10*x* with an inner wall surface that curves to the outer side in the radial direction toward the upper surface 10*a* of the insulation layer 10 is formed. The through hole 10*x* is for example formed by a photolithography method. In the present embodiment, a through hole 10*x* having an inner wall surface with a curved surface is formed for example by adjusting the light exposure in the photo lithography method and heat curing (or heat hardening) the insulation resin while heating it in steps. At each heating step of the insulation layer 10, the rise range width of the heating temperature of the insulation ion layer 10 can be increased or decreased to reach a predetermined target rise value. The target rise value is for example determined based on the respective boiling points of the plurality of solutions contained in the insulation layer 10.

Figure 5:
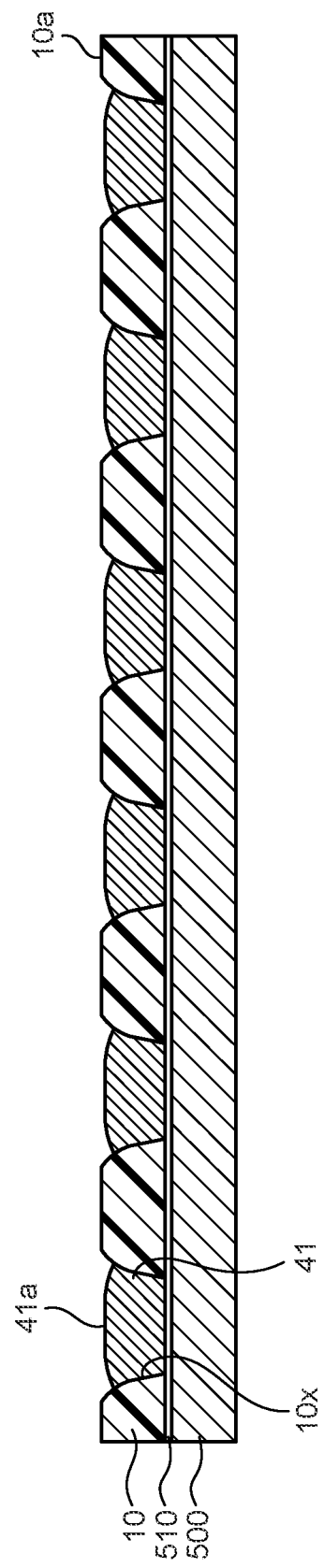
FIG. 5 is a drawing illustrating a specific example of a pad forming step in the first embodiment.

Next, as illustrated in FIG. 5, a pad 41 with an upper surface 41*a* exposed from the upper surface 10*a* of the insulation layer 10, and having a curved surface curving in a protruding shape is formed in the through hole 10*x*. The pad 41 is for example formed by an electrolytic copper plating method that uses the seed layer 510 as a power feed layer. In the present embodiment, the upper surface 41*a* of the pad 41 is exposed from the upper surface 10*a* of the insulation layer 10, and also curved convexly (in a protruding shape) so that no corners are formed on the upper surface 41*a* of the pad 41. The stress on the portion connecting the upper surface 41*a* of the pad 41 with the via wiring 22*a* described below is in this way dispersed to the entire upper surface 41*a*. The fracturing of the pad 41 and the via with 22*a* can in this way be suppressed and the connection reliability of the pad 41 and the via wiring 22*a* can in this way be improved.

The outer end of the upper surface 41*a* of the pad 41 crosses the inner wall surface of the through hole 10*x* at a position lower the upper surface 10*a* of the insulation layer 10, and curves in an upward protrusion toward the same surface as the upper surface 10*a* of the insulation layer 10. The upper surface 41*a* of the pad 41 preferably curves so that the peak reaches a position on the same surface as the upper surface of the insulation layer 10. In this way, the difference in height between the upper surface 41*a* of the pad 41 and the upper surface 10*a* of the insulation layer 10 are suppressed and the flatness of the upper surface 21*a* of the insulation layer 21 described below can be maintained.

Figure 6:
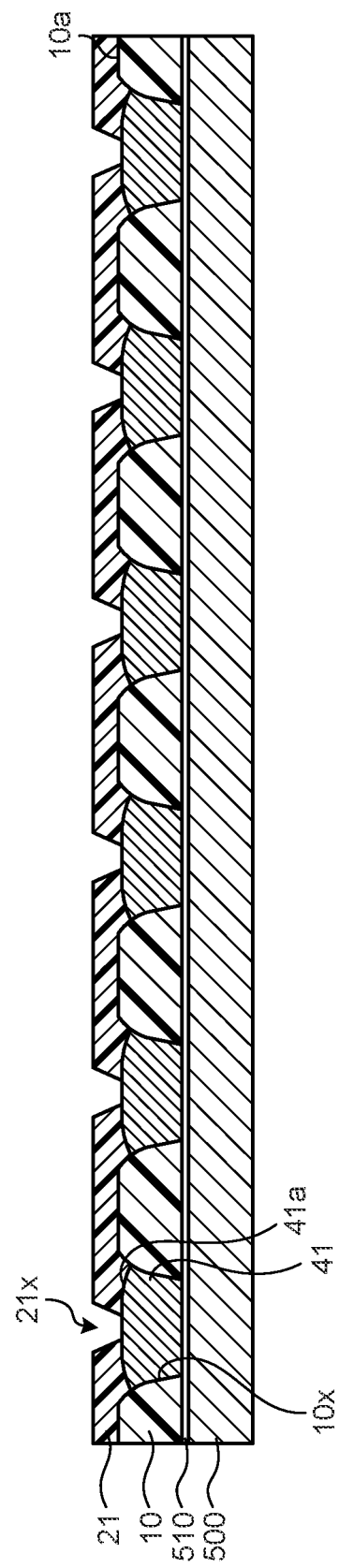
FIG. 6 is a drawing illustrating a specific example of a second insulation layer forming step of the first embodiment.

Next, as illustrated in FIG. 6, the insulation layer 21 including the through hole 21*x* exposing a portion of the upper surface 41*a* of the pad 41 is formed. The insulation layer 21 with the lower surface curving according to the curve of the upper surface 41*a* of the pad formed on the insulation layer 10. The insulation layer 21 is formed so as to fill inside opening of the through hole 10*x*. The difference in height between the upper surface 41*a* of the pad 41 and the upper surface 10*a* of the insulation layer 10 is suppressed at this time so the flatness of the upper surface of insulation layer 21 can also be maintained. For example, when the method for forming the insulation layer 21 utilizes a resin film the resin film is laminated on the upper surface 10a of the insulation layer 10 by thermocompression bonding, and the insulation layer 21 is formed by patterning the resin film by the photolithography method. Another method for forming the insulation layer 21 is applying an insulation resin in a liquid or paste state on the upper surface 10a of the insulation layer 10 by spin coating or other method, and patterning that insulation resin by the photolithography method to form the insulation layer 21.

Figure 7:
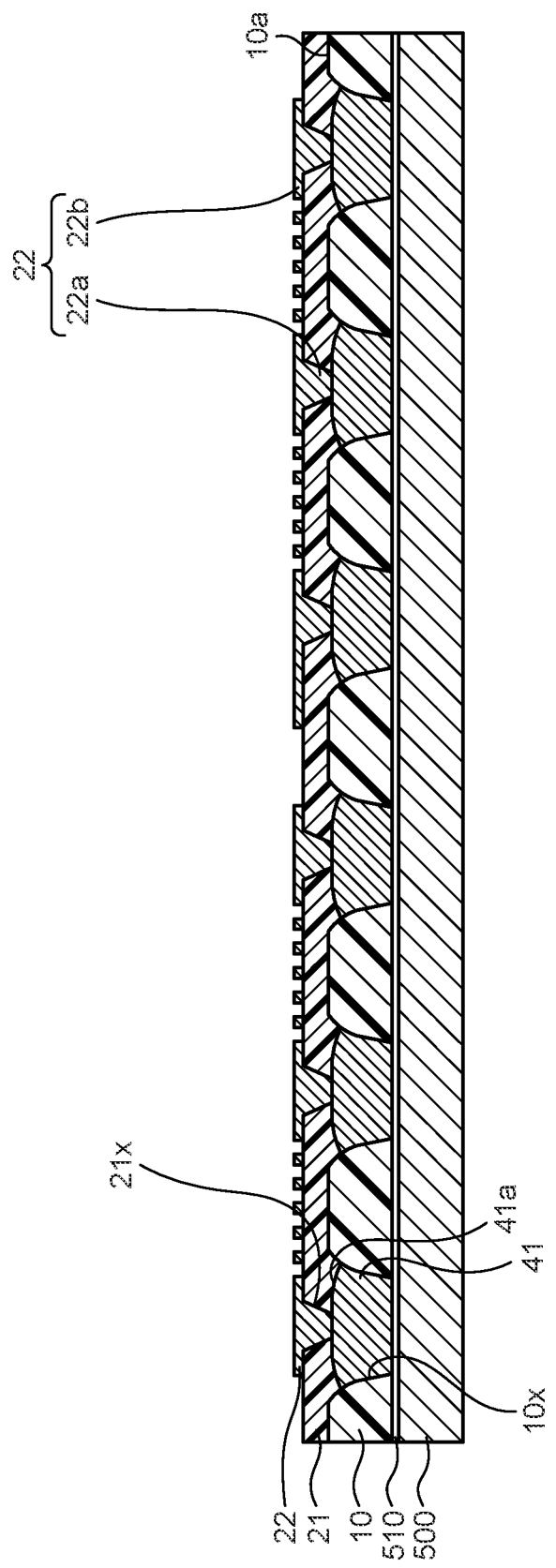
FIG. 7 is a drawing illustrating a specific example of a first wiring layer forming step of the first embodiment.

Next at the step illustrated in FIG. 7, a seed layer (not shown in the drawing) is formed to cover the entire inner surface (entire inner surface of the through hole 21x and entire surface of upper surface 41a of the pad 41 exposed by the through hole 21x) of the through hole 21x and the upper surface of the insulation layer 21. The seed layer can for example be formed the sputtering met or the electroless plating method.

For example, when forming a seed layer by the sputtering method, a Ti layer is first of all formed by depositing titanium (Ti) by sputtering on the upper surface of the insulation layer 21 and the inner surface of the through hole 21x so as to cover the upper surface of the insulation layer 21 and the inner surface of the through hole 21x. A copper (Cu) layer is then formed by depositing copper by sputtering on the titanium (Ti) layer. A seed layer with a two-layer structure (Ti layer/Cu layer) can be formed in this way. When forming a seed layer by the electroless plating method, a seed layer can for example be formed from a copper (Cu) layer (one-layer structure) by the electroless plating method.

Next, a resist layer including an opening pattern is formed at predetermined positions on the seed layer (not shown in drawing). An opening pattern is formed so as to expose the portion of the seed layer corresponding to the forming region for the wiring layer 22 (See FIG. 1). A material with plating resistance in the plating process in the next step for example can be utilized as material for the resist layer. A photosensitive dry film resist or a liquid photoresist (e.g., a dry film resist or a liquid resist containing novolac resin, acrylic resin, or the can be utilized as the material for the resist layer. For example, when utilizing a photosensitive dry film resist, a dry film is laminated on the upper surface of the seed layer by thermocompression bonding, and a resist layer with an opening pattern can be formed by patterning the dry film by the photolithography method. A resist layer can be formed by way of the same process even when utilizing liquid photoresist.

Next, the electroplating method (here, the electrolytic copper plating method) utilizing a seed layer as a plating power feed layer is performed on the seed layer exposed from the opening pattern of the resist layer by utilizing the resist layer serving as the plating mask. A metal layer (subsequent metal layer serving as the via wiring 22a later) filling the through hole 21x further inwards than the seed layer is formed in this way, and a metal layer (subsequent metal layer serving as the wiring pattern 22b) is formed on the seed layer formed on the upper surface of the insulation layer 21.

The resist layer is next removed for example by using an alkaline stripping solution. Next, unnecessary seed layer is removed by etching that utilizes the metal layer as an etching mask. For example, when the seed layer is a Ti layer and Cu layer, then the Cu layer is first of all removed by wet etching using a sulfuric acid/hydrogen peroxide-based etchant. The Ti layer is then removed by wet etching using KOH type etching fluid or dry etching using etching gas such as CF4.

In this step, as illustrated in FIG. 7, the via wiring 22a including a seed layer and a metal layer formed in the through hole 10x is formed within the through hole 21x. The wiring pattern 22b including a seed layer and a metal layer formed on the upper surface of the insulation layer 21 is formed on the insulation layer 21. In this way, a wiring layer 22 formed from the via wiring 22a and a wiring pattern 22b is formed. The wiring layer 22 is in this way formed by the semi-additive method.

Figure 8:
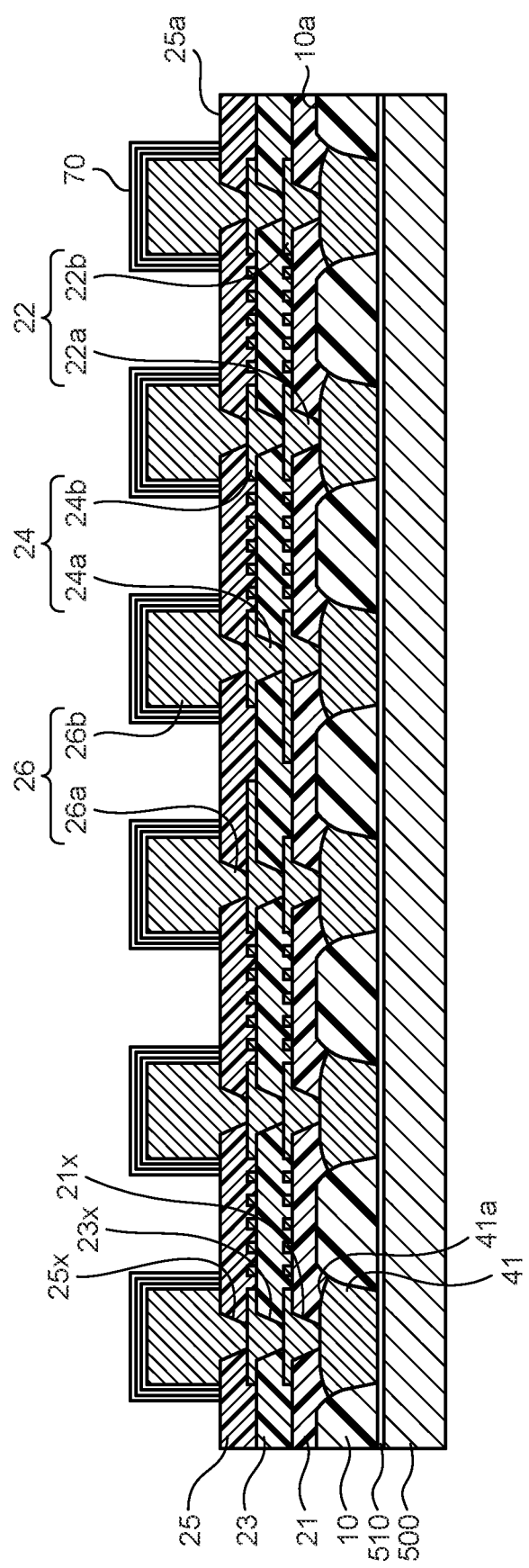
FIG. 8 is a drawing illustrating a specific example of a lamination step of the first embodiment.

Next, at the step illustrated in FIG. 8, the insulation layer 23 including a through hole 23x exposing a portion of the upper surface of the wiring layer 22 is formed on the insulation layer 21, the same as the steps illustrated in FIG. 6 and FIG. 7. Then, for example by utilizing the semi-additive method, the wiring layer 24 including the via wiring 24a filled into the through hole 23x and the wiring pattern 24b electrically connected to the wiring layer 22 by way of the via wiring 24a and laminated on the insulation layer 23 is formed.

Next, the insulation layer 25 including a through hole 25x exposing a portion of the upper surface of the wiring layer 24 is formed on the insulation layer 23 the same as the steps illustrated in FIGS. 6 and 7. Then, for example by utilizing the semi-additive method, the wiring layer 26 including the via wiring 26a filling the through hole 25x and a wiring pattern 26b laminated on the upper surface 25a of the insulation layer 25 and electrically connecting with the wiring layer 24 by way of the via wiring 26a is formed. If needed, the surface treatment layer 70 is formed on the surface (the upper surface and side surface, or just the upper surface) of the wiring pattern. 26b.

Figure 9:
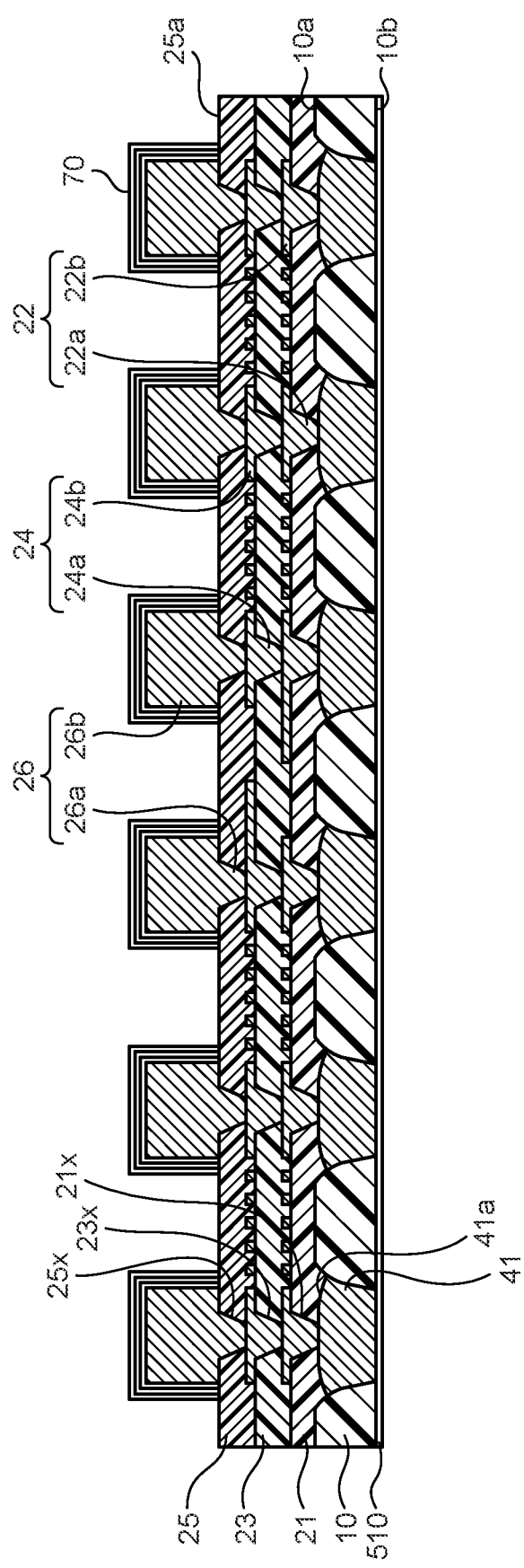
FIG. 9 is a drawing illustrating a specific example of a stripping step of the first embodiment.

Next, as illustrated in FIG. 9, the support member 500 is peeled from the seed layer 510 to expose the lower surface of the seed layer 510. The peeling of the support member 500 may also be performed by a machine. If the support member 500 is a metal plate, it may be removed by wet etching utilizing for example, ferric chloride aqueous solution, cupric chloride aqueous solution, or ammonium persulfate aqueous solution. The seed layer 510 at this time functions as a stopper layer during etching of the metal plate of the support member 500.

Figure 10:
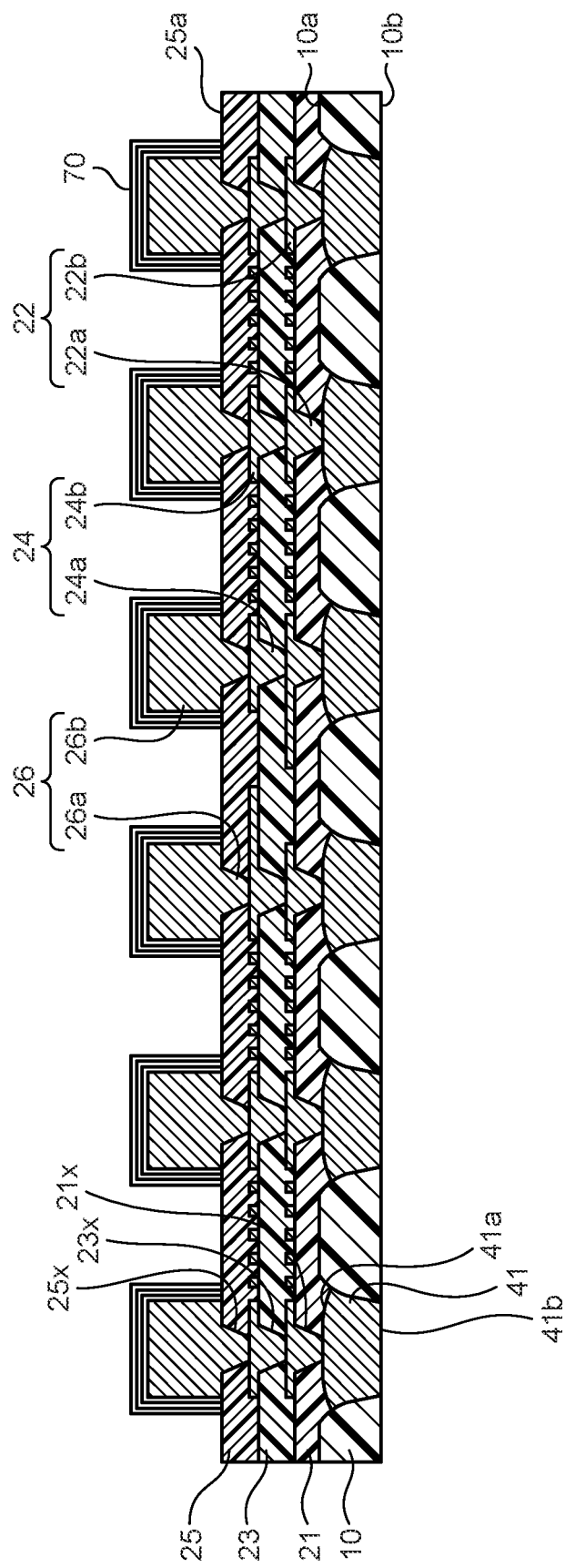
FIG. 10 is a drawing illustrating a specific example of a seed layer removal step of the first embodiment.

Next, as illustrated in FIG. 10, the seed layer 510 is removed by etching, and the lower surface 41b of the pad 41 is exposed along with the lower surface 10b of the insulation layer 10. For example, the removal of the seed layer 510 can be performed by dry etching (plasma etching) using etching gas such as CF4. The pad 41 at this time functions as a stopper layer during etching of the seed layer 510.

Figure 11:
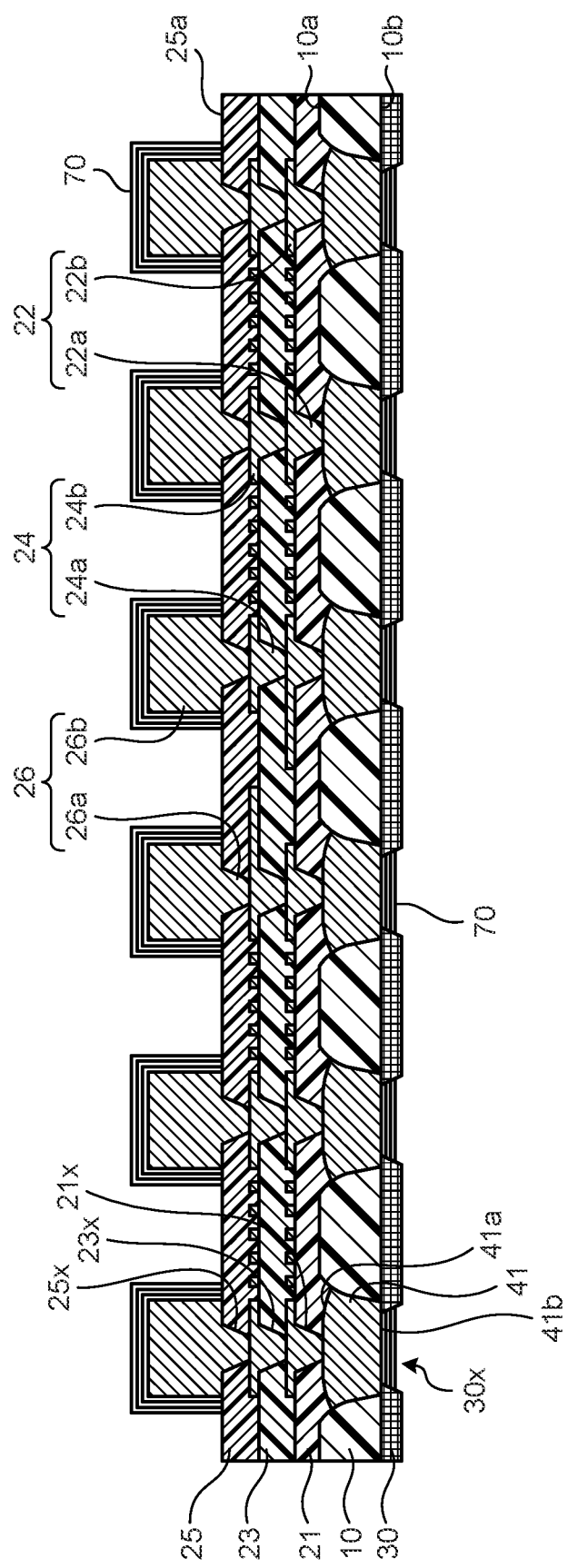
FIG. 11 is a drawing illustrating a specific example of a solder resist layer forming step of the first embodiment.

Next, at the step illustrated in FIG. 11, a solder resist layer 30 including an opening 30x to expose a portion of the lower surface 41b of the pad 41 is laminated on the lower surface 10b of the insulation layer 10. The solder resist layer 30 can for example be formed by laminating a photosensitive solder resist film or applying a liquid solder resist, and patterning the resist in the necessary desired shape. In this way, a portion of the lower surface 41b of the pad 41 is exposed from the opening 30x of the solder resist layer 30 as an external connection pad. A surface treatment layer is then formed on the external connector pad if required. When not forming a solder resist layer 30, a surface treatment layer 70 is formed on the surface (lower surface 41b) of the pad 41 as needed, after removing the seed layer 510 in the step in FIG. 10. The forming of the surface treatment layer 70 for the surface (lower surface 41b) of the pad 41 and the surface of the wiring layer 26 (wiring pattern 26b) may be performed by the different step as described above, and also may be simultaneously formed on the surface of the wiring layer 26 (wiring pattern 26b) when forming the surface treatment layer 70 on the surface (lower surface 41b) of the pad 41.

Figure 12:
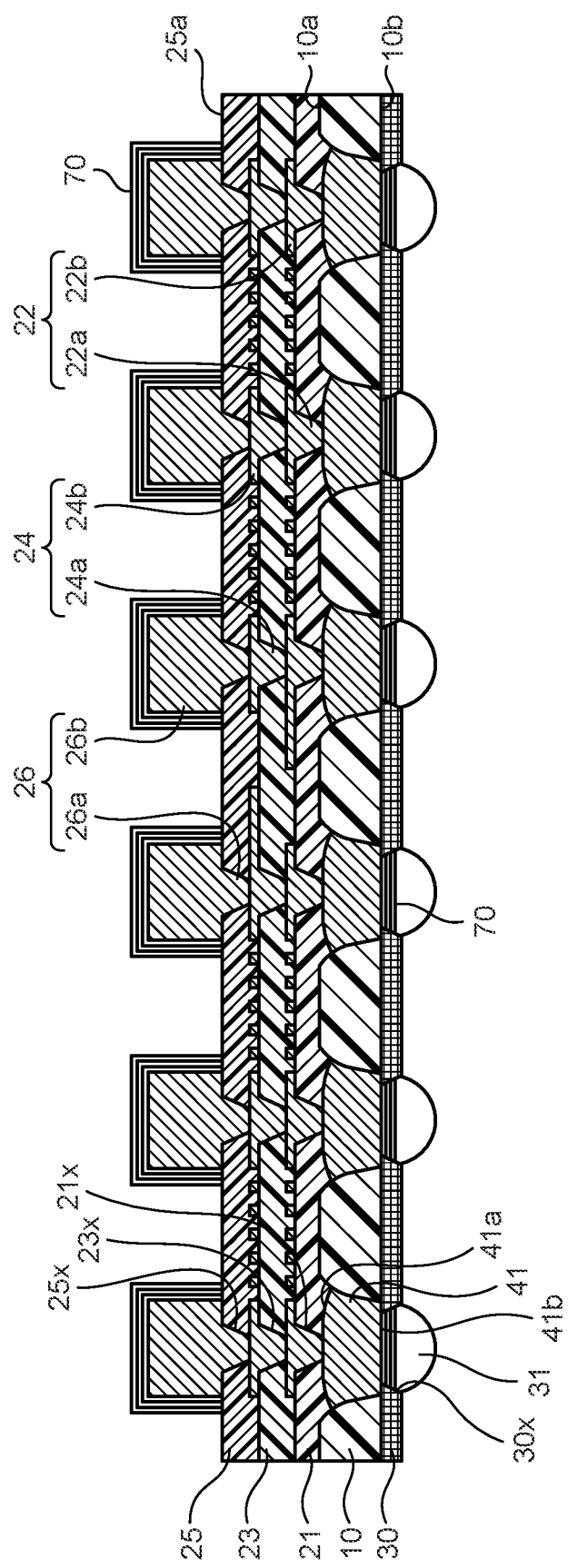
FIG. 12 is a drawing illustrating a specific example of a bump forming step of the first embodiment.

Next, as illustrated in FIG. 12, the bump 31 is formed on the lower surface 41b of the pad 41 that is exposed from the opening 30x of the solder resist layer 30. When a surface treatment layer 70 is formed on the lower surface 41b of the pad 41, the surface treatment layer 70 is interposed between the bump 31 and the lower surface 41b of the pad 41. The wiring substrate 1 illustrated in FIG. 1 can in this way be manufactured by the above described manufacturing steps.

Method for Manufacturing Semiconductor Device

Next, a specific example of the method for manufacturing the semiconductor device 100 according to the first embodiment is described next.

The case when using the underfill resin as the adhesion layer 120 (See FIG. 2) is first of all described. The wiring substrate 1 is mounted on the wiring substrate 110. Specifically, the bump 31 is for example heated to be melted and bonded in a state with the wiring substrate pressed against the wiring substrate 110 by utilizing a bonding tool.

Next, the semiconductor chip 130 is mounted on the wiring substrate 1. Specifically, the solder bump of the semiconductor chip 130 is for example heated to be melted and bonded in a state with the semiconductor chip 130 pressed against the wiring substrate 1 by utilizing a bonding tool, in the same way as the mounting of the wiring substrate 1.

Next, along with filling the adhesion layer 120 (underfill resin) between the lower surface (lower surface of the solder resist layer 30) of the wiring substrate 1 and the substrate 110, the underfill resin 131 is filled between the semiconductor chip 130 and the upper surface (upper surface 25a of the insulation layer 25) of the wiring substrate 1. The semiconductor device 100 is achieved in this way.

The case where non-conductive film (NSF) and anisotropic conductive film (ACF) are utilized instead of the underfill resin as the adhesion layer 120 is described next. The adhesion layer 120 is first of all formed on the lower surface (lower surface of the solder resist layer 30) of the wiring substrate 1.

Next, the wiring substrate 1 is mounted on the wring substrate 110. Specifically, the bump 31 is melted and bonded along with for example heat-curing the resin ingredient of the adhesion layer 120 in a state with the wiring substrate 1 pressed against the wiring substrate 110 by utilizing a bonding tool.

Next, the semiconductor chip 130 is mounted on the wiring substrate 1. Specifically, the solder bump of the semiconductor chip 130 is for example heated to be melted and bonded in a state with the semiconductor chip 130 pressed against the wiring substrate 1 by utilizing a bonding tool, in the same way as the mounting of the wiring substrate 1.

Next, the underfill resin 131 is filled between the upper surface of the wiring substrate 1 (upper surface 25a of the insulation layer 25) and the semiconductor chip 130. The semiconductor device 100 is obtained in this way.

The wiring substrate of the first embodiment as described above, includes the first insulation layer, the first through hole, the pad, the second insulation layer, and the first wiring layer. The first insulation layer contains insulating resin. The first through hole passes through the first insulation layer in the thickness direction. The pad is mounted within the first through hole. The second insulation layer is laminated on the first surface of the first insulation layer and contains insulating resin. The first wiring layer is mounted in the second insulation layer and connects to the pad. The connecting surface of the pad that connects to the first wiring layer includes a curved surface curving in a protruding shape toward the first surface of the first insulation layer in this way, no corners are formed on the upper surface of the pad. A concentrated stress at the portion connecting the via wiring formed above the pad, with the upper surface of the pad can therefore be alleviated even when stress is applied to the pad from another wiring substrate when the wiring substrate is joined to another wiring substrate. The fracturing of the pad and the via wiring can consequently be suppressed, and the connection reliability between the pad and the wiring layer by way of the via wiring can be improved. When a corner is in contact with the insulation layer, the occurrence of crack starting from the corner as the origin point can be prevented. The difference in height between the contact surface of the pad and one surface of the first insulation layer is suppressed at this time, so the flatness of the upper surface and the lower surface of other insulation layers formed on the first insulation layer can also be maintained.

Also in the wiring substrate of the first embodiment, the inner wall surface of the first through hole is formed in a curved surface curving in a protrusion toward the interior of the opening of the first through hole. The upper surface of the pad can therefore be formed in a curved surface shape with a bulge toward the upper surface of the first insulation layer accord the inner wall surface the first through hole so that stress on the connecting surface of the pad and the portion connecting the via wiring formed above the pad can be dispersed to the entire connecting surface of the via wiring and the pad. The fracturing of the pad and the via wiring can consequently be suppressed in a stable manner, and the connection reliability with the wiring layer by way of the pad and the via wiring can be improved.

Second Embodiment

The first embodiment utilizes the pad 41 including a curved surface curving in a protruding shape as an external connector terminal for connecting with other wiring substrates. In contrast, in a second embodiment, the 41 including a curved surface curving in a protruding shape is utilized as a terminal for mounting an electronic component for electrically connecting to an electronic component such as a semiconductor chip. Also in the second embodiment, an insulation layer 50 is laminated onto the upper surface 25a of the insulation layer 25.

Structure of Wiring Substrate

Figure 13:
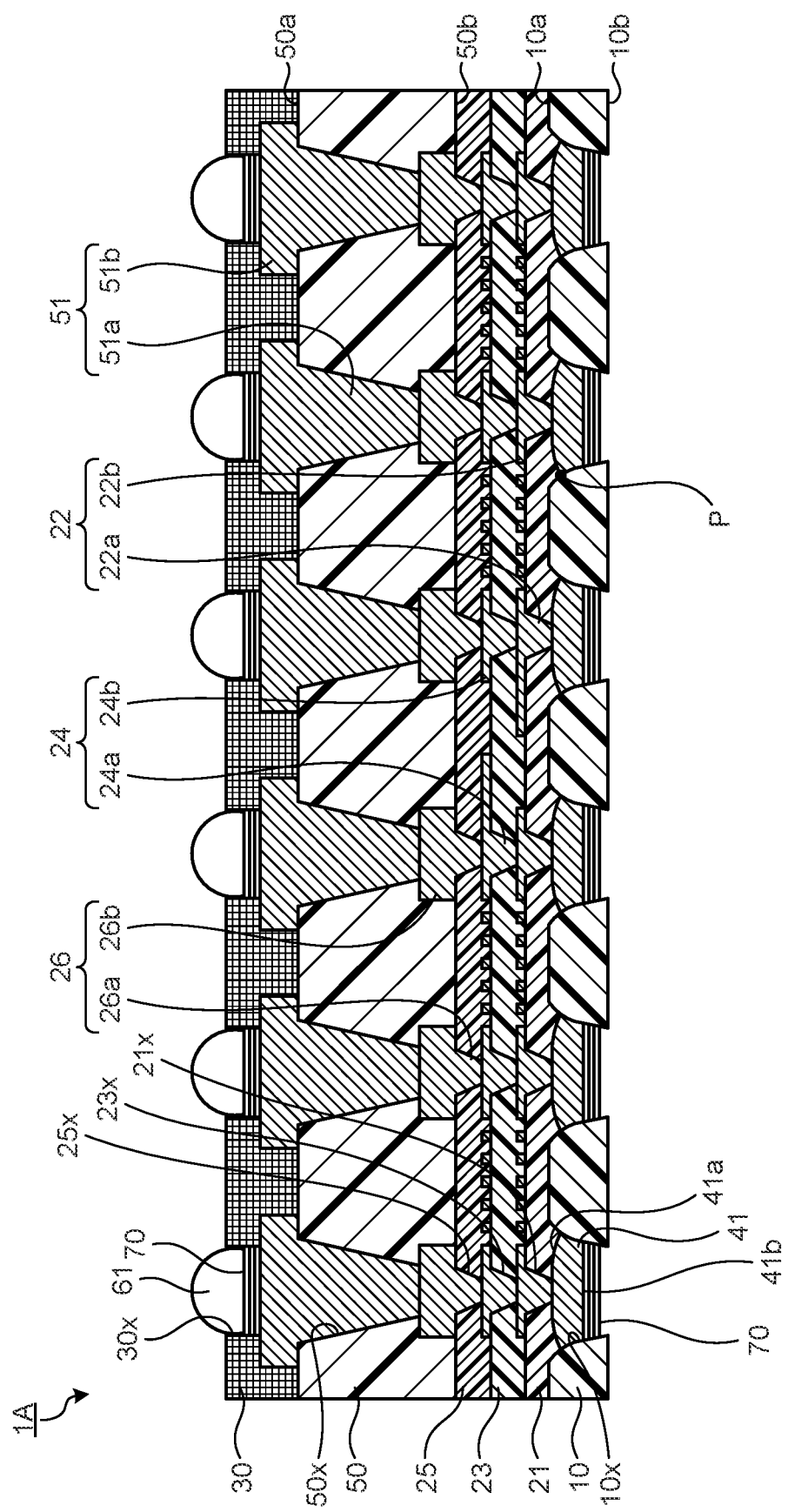
FIG. 13 is a drawing illustrating one example the structure of the wiring substrate of a second embodiment.

FIG. 13 is a drawing illustrating one example of the structure of a wiring substrate 1A of the second embodiment. FIG. 13 schematically illustrates a cross section of the wiring substrate 1A.

The wiring substrate 1A is a laminate structure, and mainly includes the insulation layers 10, 21, 23, 25, 50 and the pad 41, the wiring layers 22, 24, 26, 51 and the solder resist layer 30. The pad 41 is mounted on the insulation layer 10. Hereafter, for purposes of simplifying the description, the surface on the insulation layer 10 side of the wiring substrate 1A is called the lower side, and the surface on the solder resist layer 30 side is called the upper side. Also in FIG. 13, for convenience in simplifying the description, in the wiring substrate 1A, the insulation layer 10 side for mounting electronic components such as a semiconductor chip is positioned facing downwards, and the solder resist layer 30 side for connecting to another wiring substrate is positioned facing upwards in the drawing. However, the wiring substrate 1A may for example be utilized with the upper and lower sides reversed and may be utilized in an optional position.

The insulation layers 10, 21, 23, 25 are formed from insulating resin. The material for the insulation layers 10, 21, 23, 25 is the same as in the first embodiment. The insulation layer 50 is formed from insulating resin. The material for the insulation layer 50 is for example an insulating resin that is obtained by adding a reinforcing material to a thermosetting resin can be utilized. The material for the insulation layer 50 can for example utilize a so-called glass epoxy resin that is obtained by impregnating a glass cloth (or glass woven fabric) as a reinforcing material with a thermosetting type insulating resin containing epoxy resin as the main ingredient. The thermosetting type insulating resin is not limited to epoxy resin and may for example utilize insulating resin such as polyimide resin or cyanate resin. The insulation layer 50 may for example include filler such as silica or alumina. The material for the pad 41 and the wiring layers 22, 24, 26 is the same as the first embodiment. The material for the wiring layer 51 can utilize copper, for example.

Figure 18:
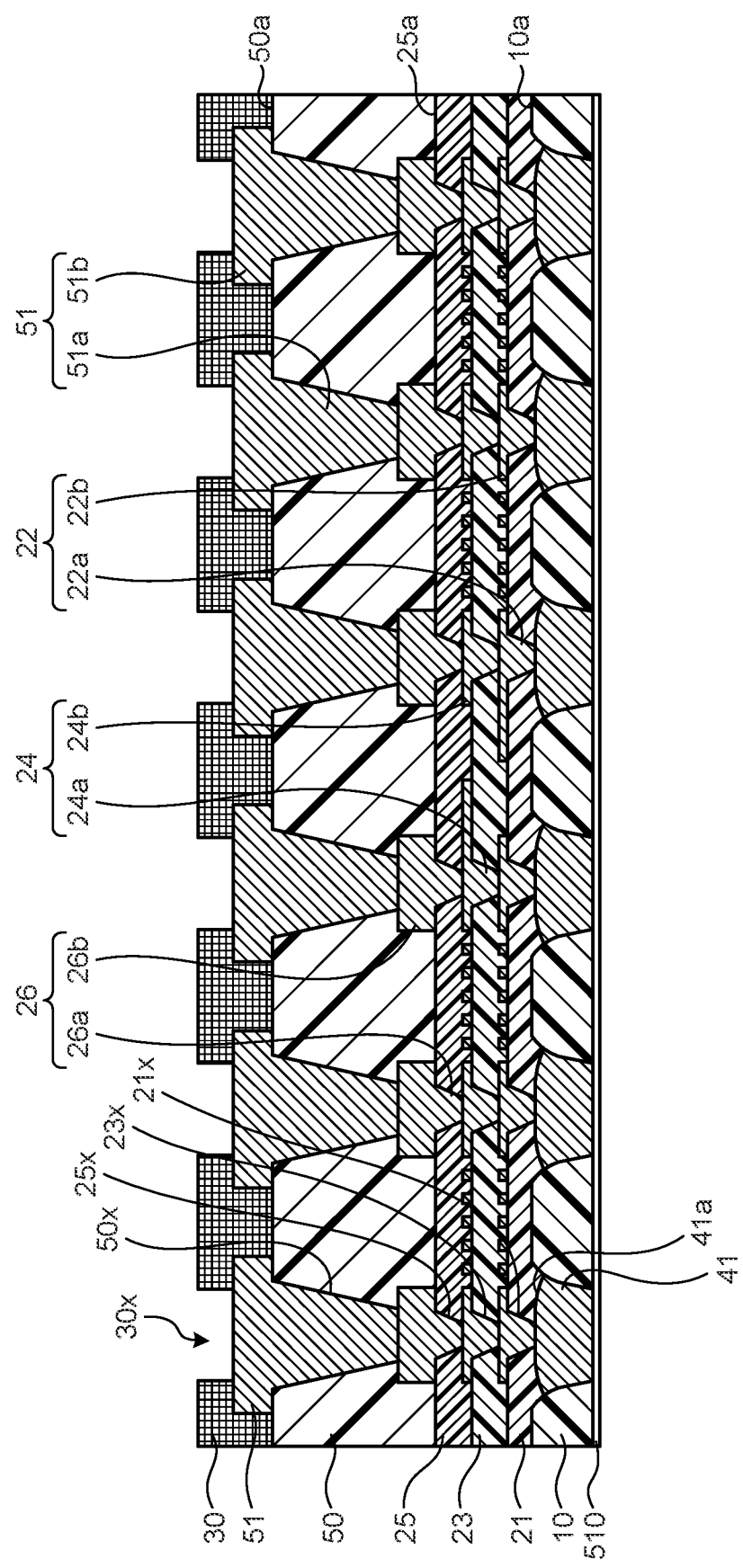
FIG. 18 is a drawing illustrating a specific example of the stripping step of the second embodiment.

The same as in the first embodiment, in the insulation layer 10, the through holes 10x opening at the necessary positions on the upper surface 10a of the insulation layer 10, and passing through the insulation layer 10 are formed in the thickness direction. In FIG. 18, each of the through holes 10x is formed in a taper shape so the diameter becomes gradually smaller from the upper surface 10a toward the lower surface 10b. The through hole 10x for example is formed in an approximately reverse truncated cone shape with an opening diameter at the opening end on the lower surface 10b side that is smaller than the opening diameter at the opening end on the upper surface 10a side. The opening diameter at the opening end on the upper surface 10a side of the through hole 10x for example can be set to approximately 15 to 25 µm, and the opening diameter at the opening end on the lower surface 10b side of the through hole 10x can be set to approximately 5 to 15 µm. The thickness of the insulation layer 10 can be set for example to approximately 8 to 14 µm. In the example of the present embodiment, the inner wall surface of the through hole 10x is formed as a curved surface curving in a protrusion toward the interior of the opening of the through hole 10x.

The pad 41 is for example a terminal for mounting an electronic component that connects electrically to an electronic component such as a semiconductor chip. (See FIG. 14). The pad 41 is formed inside the through hole 10x. The upper surface 41a of the pad 41 is a connecting surface that connects to the via wiring 22a of the wiring layer 22. The lower surface 41b of the pad 41 is exposed from the lower surface 10b of the insulation layer 10 and is a connecting surface that connects to other electronic components. The upper surface 41a of the pad 41 is exposed from the upper surface 10a of the insulation layer 10 and also includes a curved surface curving in a protrusion toward the upper surface 10a of the insulation layer 10. The outer edge of the upper surface 41a of the pad 41 contacts the inner wall surface of the through hole 10x at a position lower than the upper surface 10a of the insulation layer 10 (contact point P). In the present embodiment, the inner wall of the through hole 10x is formed as a curved surface curving in a protrusion toward the interior of the opening of the through hole 10x. The upper surface 41a of the pad 41 is formed in a curved surface shape bulging upward (curved surface protrusion) toward the upper surface of the insulation layer 10 according to the inner wall surface of the through hole 10x. Only the upper surface 41a of the pad 41 is formed in a curved surface in a protruding shape. The thickness from the lower surface 41b to the center (peak) of the upper surface 41a of the pad 41 can for example be set to approximately 8 to 11 µm. The thickness of the pad 41 can be made thinner than the thickness of the insulation layer 10 or can even be the same thickness. The contact point P with the outer edge of the upper surface 41a of the pad 41 and the inner wall surface 41a of the through hole 10x is at a position lower than the upper surface 10a of the insulation layer 10, even if the thickness of the pad 41 is thinner than the thickness of the insulation layer 10, or even if the thickness of the pad 41 is the same thickness as the insulation layer 10. The upper surface 41a of the pad 41 is a curved surface with a continuous protrusion (bulge) from the center peak to the outer end (contact point P with the inner wall surface of the through hole 10x). Only the upper surface 41a of the pad 41 is formed in a curved surface a protruding shape. The lower surface 41b of the pad 41 is exposed from the lower surface 10b of the insulation layer 10. The lower surface 41b of the pad 41 may be formed for example retracted (receding inwards) to the side of the upper surface 10a more than the lower surface 10b of the insulation layer 10. In other words, in FIG. 13, the lower surface 41b of the pad 41 may also be positioned on the upper surface 10a side rather than the lower surface 10b of the insulation layer 10. The depth of the recess from the lower surface 10b of the insulation layer 10 to the lower surface 41b of the pad 41 may for example be set to approximately 1 to 5 µm. The surface treatment layer 70 may be formed as needed, below the lower surface 41b of the pad 41 that is exposed from the through hole 10x. As one example, the surface treatment layer 70 can be the same as the surface treatment layer of the first embodiment. The pitch of the pad 41 may for example be set to approximately 30 to 60 µm.

The insulation layers 21, 23, 25 and the wiring layers 22, 24 can be set the same as in the first embodiment so a description is omitted here.

The wiring layer 26 is formed on the insulation layer 25. The wiring layer 26 includes a via wiring 26a filled within the through hole 25x, and a wiring pattern 26b formed on the upper surface 25a of the insulation layer 25. The lower end surface of the via wiring 26a directly connects to a portion of the wiring pattern 24b of the wiring layer 24. The thickness of the wiring pattern 26b can be set to approximately 8 to 12 µm. The lane-and-space (L/S) of the wiring layer 26 can for example be set larger than the line-and-space of the wiring layer 22, 24.

The insulation layer 50 is formed on the upper surface 25a of the insulation layer 25 so as to cover the wiring layer 26. In the insulation layer 50, a through hole 50x passing through the thickness direction of the insulation layer 25 is formed to expose a portion of the upper surface of the wiring pattern 26b of the wiring layer 26. In FIG. 13, the through hole 50x is formed in a taper shape with a diameter that becomes gradually smaller from an upper surface 50a toward a lower surface 50b. The through hole 50x for example is formed in an approximately reverse truncated cone shape with an opening diameter at the opening end on the lower surface 50b side that is smaller than the opening diameter at the opening end on the upper surface 50a side. The thickness of the insulation layer 50 can for example be set to approximately 20 to 55 µm. The opening diameter at the opening end on the upper surface 50a side of the through hole 50x can be set to approximately 50 to 100 µm.

The wiring layer 51 is formed on the insulation layer 50. The wiring layer 51 includes a via wiring 51a filling the interior of the through hole 50x, and a wiring pattern 51b formed on the upper surface 50a of the insulation layer 50. The lower end surface of the via wiring 51a directly connects to a portion of the wiring pattern 26b of the with ring layer 26. The thickness of the wiring pattern 51b can for example be set to approximately 15 to 20 μm. The line-and-space (L/S) of the wiring layer 51 can for example be set to approximately 20 μm/20 μm. This wiring pattern 51b functions as an external connector terminal that electrically connects with another wiring substrate. The upper surface of the wiring pattern 51b is a connecting surface for electrically connecting to another wiring substrate. The pitch of the wiring layer 51 may for example be set to approximately 200 to 300 μm.

The solder resist layer 30 is a protective layer covering the upper surface 50a of the insulation layer 50 and a portion of the upper surface of the wiring pattern 51b of the wiring layer 51, and protecting the upper surface 50a of the insulation layer 50 and the wiring layer 51. The opening 30x for exposing a portion of the upper surface of the wiring pattern 51b of the wiring layer 51 is formed in the solder resist layer 30. Photosensitive insulating resin utilizing phenol resin, polyimide resin, or the like as the main ingredient can be utilized as the material for the solder resist layer 30. The solder resist layer 30 may for example include filler such as silica or alumina. The thickness of the solder resist layer 30 can for example be set to approximately 20 to 25 μm. A solder resist layer 30 is formed in the wiring substrate 1A of the second embodiment but need not be provided as required by circumstances.

The surface treatment layer 70 may be formed as needed on the upper surface of the wiring pattern. 51b of the wiring layer 51 that is exposed from the opening 30x. An example of the surface treatment layer 70 may be the same as the surface treatment layer of the first embodiment. The planar shape of the opening 30x and the upper surface of the wiring pattern 51b of the wiring layer 51 can be set to an optional size and an optional shape. The planar shape of the opening 30x and the upper surface of the wiring pattern 51b of the wiring layer 51 can be set to a circular shape with a diameter of approximately 100 to 150 μm.

A bump 61 for connecting the upper surface of the wiring pattern 51b of the wiring layer 51 to the pad of another wiring substrate is formed on the upper surface of the wiring pattern 51b of the wiring layer 51 exposed from the opening 30x. The bump 61 may for example be the same as the bump 31 of the first embodiment.

By retracting the lower surface 41b of the pad 41 back to a position not reaching the lower surface 10b of insulation layer 10, the bonding material that bonds the pad 41 and the semiconductor chip, hangs up on the step formed between the lower surface 41b or the pad 41 and the lower surface 10b at the insulation layer 10. The bonding strength of the pad 41 and the semiconductor chip is consequently improved. Forming the insulation layer 50 having high rigidity compared to the insulation layers 10, 21, 23, and 25 can also reduce the warpage of the wiring substrate 1A.

Structure of Semiconductor Device

Figure 14:
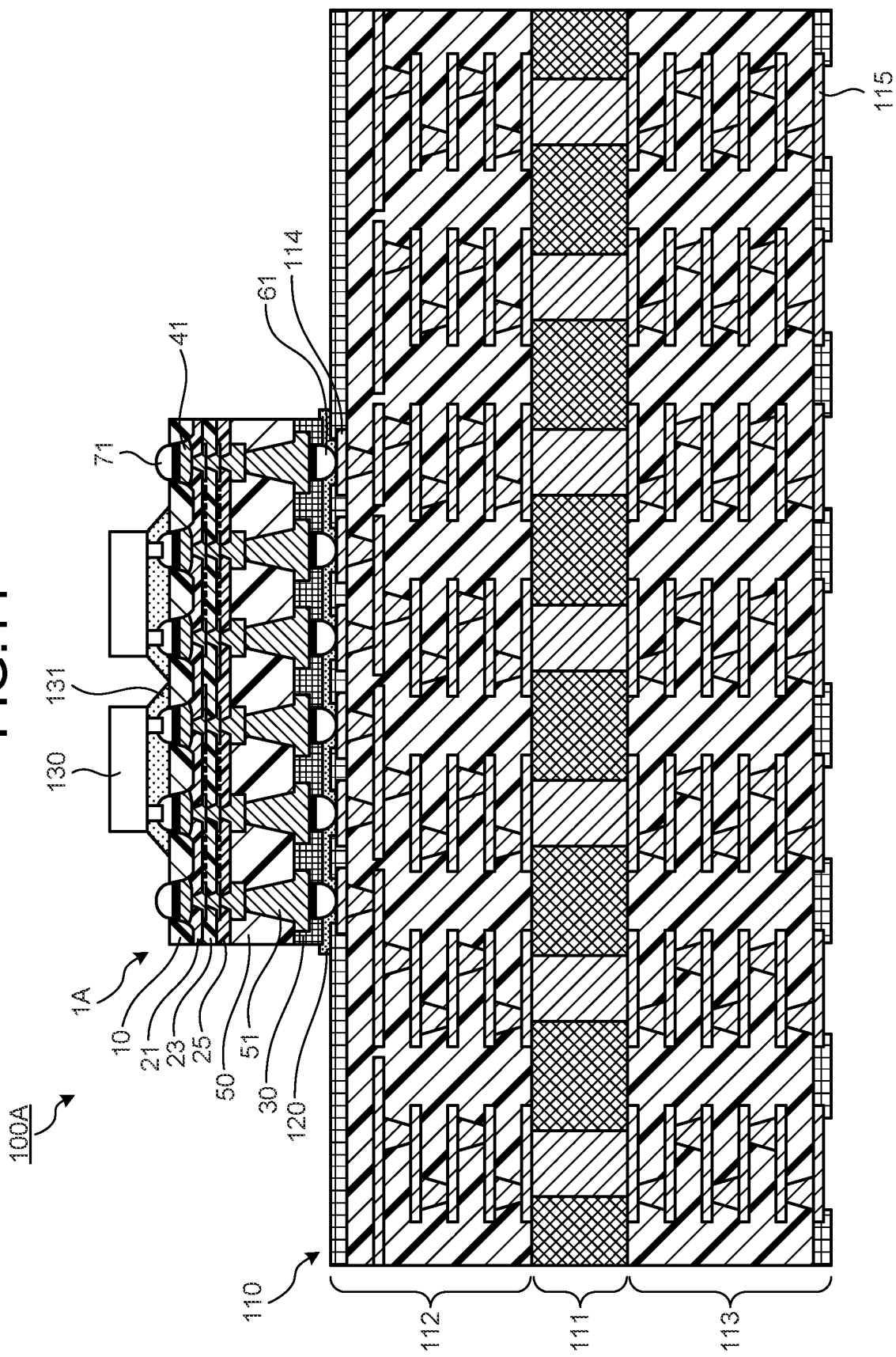
FIG. 14 is a drawing illustrating one example of the structure of the semiconductor device manufactured by utilizing the wiring substrate of the second embodiment.

FIG. 14 is a drawing illustrating one example of the structure of a semiconductor device 100A manufactured by utilizing the wiring substrate 1A of the second embodiment. FIG. 14 schematically illustrates a cross section of the semiconductor device 100A.

As illustrated in FIG. 14, the semiconductor device 100A includes the wiring substrate 110, the wiring substrate 1A, and the semiconductor chip 130. The wiring substrate 110 corresponds to the wiring substrate 110 illustrated in FIG. 2.

The wiring substrate 1A is mounted on the wiring substrate 110. In other words, along with bonding the wiring layer 51 of the wiring substrate 1A and the pad 114 of the wiring substrate 110 by way of the bump 61 and the surface treatment layer 70, the gap between the wiring substrate 1A and the wiring substrate 110 is sealed by the adhesion layer 120. NCF, ACF, and underfill resins may for example be utilized as the adhesion layer 120. A bump 71 serving as the bonding material that bonds the pad 41 and the semiconductor chip 130 is formed at the end surface of the surface treatment layer 70 formed on the lower surface (connecting surface) 41b of the pad 41. The material for the bump 71 can be the same as the bump 61.

The semiconductor chip 130 is mounted on the wiring substrate 1A. In other words, the semiconductor chip 130 is connected to the pad 41 of the wiring substrate LA by way of the surface treatment layer 70 on the connecting surface 41b for the bump 71 and the pad 41. Then, the underfill resin 131 is filled in between the semiconductor chips 130 and the wiring substrate 1A. The underfill resin 131 seals the gap between the semiconductor chip 130 and the wiring substrate 1A.

Method for Manufacturing Wiring Substrate

The method for manufacturing the wiring substrate 1A of the second embodiment is described next.

Figure 15:
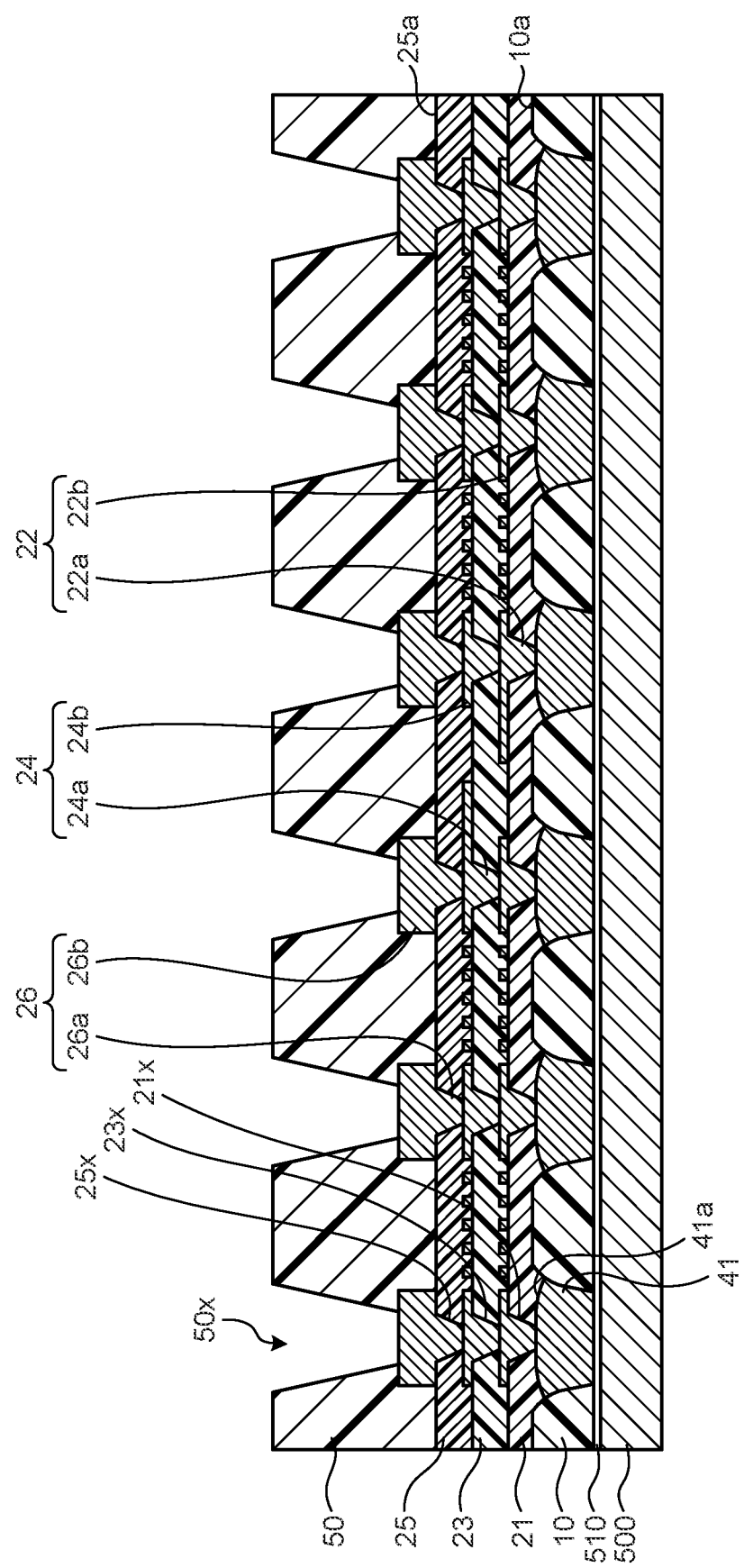
FIG. 15 is a drawing illustrating a specific example of a third insulation layer forming step of the second embodiment.

First of all, as illustrated in FIG. 15, the insulation layers 10, 21, 23, 25, the pad 41, and the wiring layers 22, 24, 26 are formed by utilizing the support member 500 and the seed layer 510. The step for forming the support member 500, the seed layer 510, the insulation layers 10, 21, 23, 25, the pad 41, and the wiring layers 22, 24, 26 are the same as in FIGS. 3 to 8 so a detailed description is omitted.

Next, as illustrated in FIG. 15, the insulation layer 50 including the through hole 50x that exposes a portion of the upper surface of the wiring pattern 26b of the wiring layer 26 is formed. When utilizing a resin film, the method for forming the insulation layer 50 is for example laminating a resin film on the upper surface 25a of the insulation layer 25 by thermocompression bonding and then performing heat curing. The insulation layer 50 is subsequently formed by patterning using laser processing.

Figure 16:
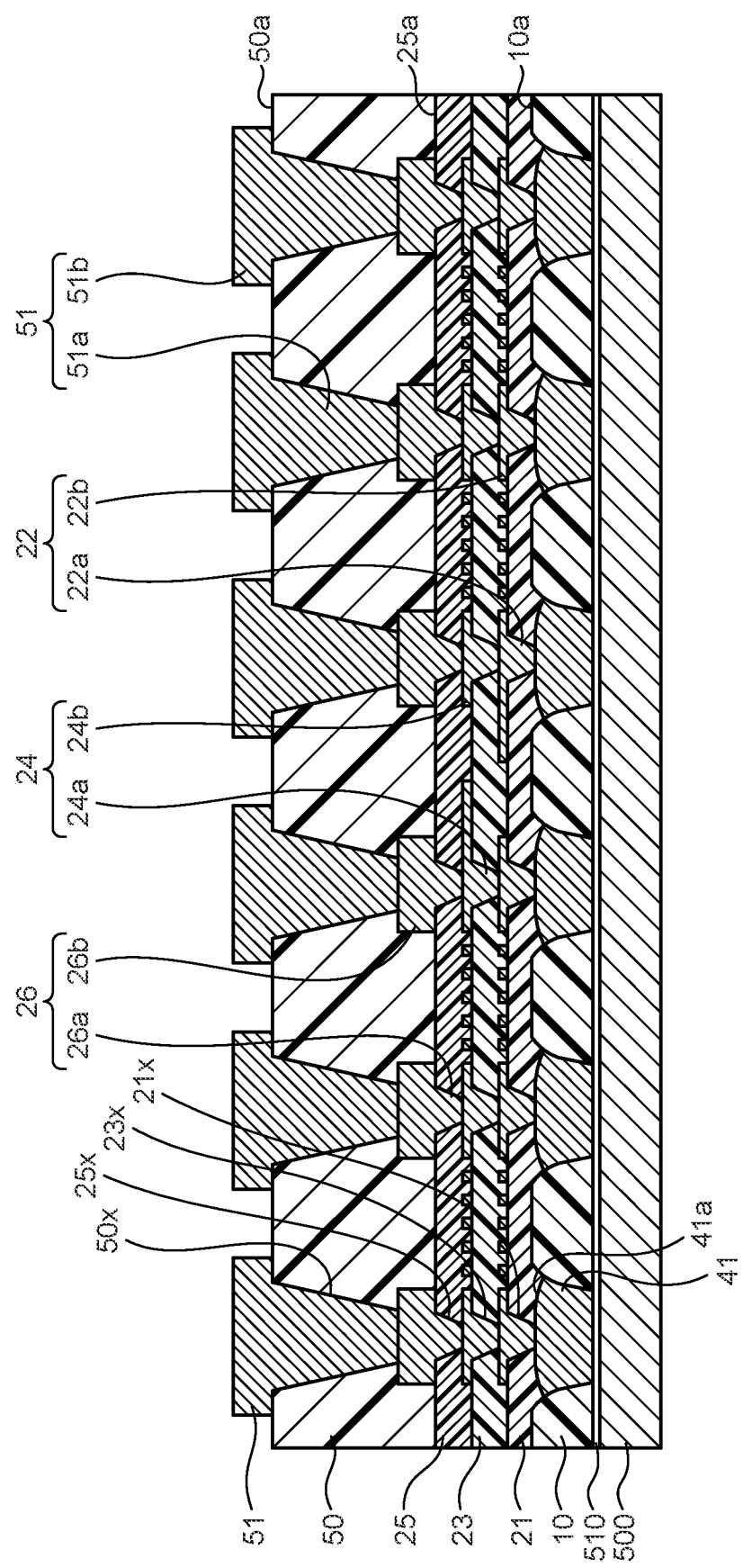
FIG. 16 is a drawing illustrating a specific example of a second wiring layer forming step of the second embodiment.

Next, at the step illustrated in FIG. 16, the seed layer (not shown in drawing) is formed so as to cover the upper surface 50a of the insulation layer 50 and the entire inner surface of the through hole 50x (the entire inner surface of the through hole 50x and the entire upper surface of the wiring pattern 26b of the wiring layer 26 exposed in the through hole 50x). The seed layer can for example be formed by an electroless plating method.

A resist layer including an opening pattern at a predetermined position is next formed on the seed layer (not shown in drawing). The opening pattern is formed so as to expose the seed layer portion corresponding to the region for forming the wiring layer 51 (See FIG. 13). The material for the resist layer can for example be the same as the first embodiment.

Next, by utilizing the resist layer serving as the plating mask, the electroplating method (here, electrolytic copper plating method) utilizing the seed layer as a plating power feed layer is performed on the seed layer exposed by the opening pattern of the resist layer. A metal layer (subsequent metal layer serving as the via wiring 51a) that fills the through hole 50x more on the inner side than the seed layer is in this way formed, and a metal layer (subsequent metal layer serving as the wiring pattern 51b) is formed on the seed layer formed on the upper surface 50a of the insulation layer 50.

The resist layer is next removed for example by using an alkaline stripping solution. In this step as illustrated in FIG. 16, the via wiring 51a including a seed layer and a metal layer formed within the through hole 50x is formed within the through hole 50x. The wiring pattern 51b including a seed layer and a metal layer formed on the upper surface 50a of the insulation layer 50 are formed on the upper surface 50a of the insulation layer 50. A wiring layer 51 is in this way formed from the via wiring 51a and the wiring pattern 51b. The wiring layer 51 is in this way formed by the semi-additive method.

Figure 17:
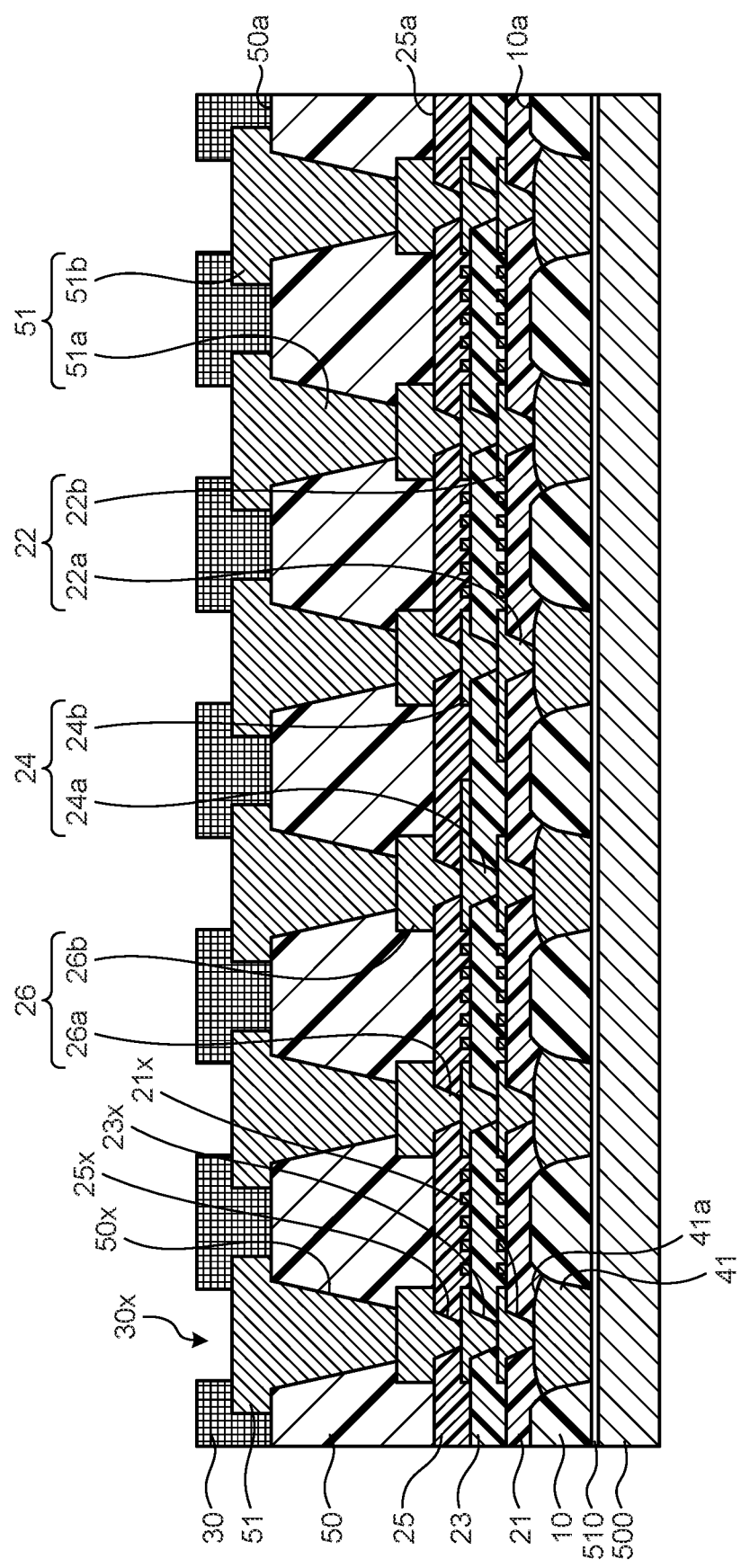
FIG. 17 is a drawing illustrating a specific example of the solder resist layer forming step of the second embodiment.

Next, at the step illustrated in FIG. 17, a solder resist layer 30 including an opening 30x for exposing a portion of the wiring pattern 51b of the wiring layer 51 is laminated on the upper surface 50a of the insulation layer 50. A portion of the wiring pattern 51b of the wiring layer 51 is in this way exposed from the opening 30x of the solder resist layer 30 as the connecting surface for external connections.

Next, as illustrated in FIG. 18, the support member 500 is stripped away from the seed layer 510 to expose the lower surface of the seed layer 510. The stripping of the support member 500 can also be performed mechanically. A support member 500 that is metal plate can also be removed by wet etching utilizing for example, ferric chloride aqueous solution, cupric chloride aqueous solution, and ammonium persulfate aqueous solution. The seed layer 510 at this time functions as a stopper layer during the etching the metal plate of the support member 500.

Figure 19:
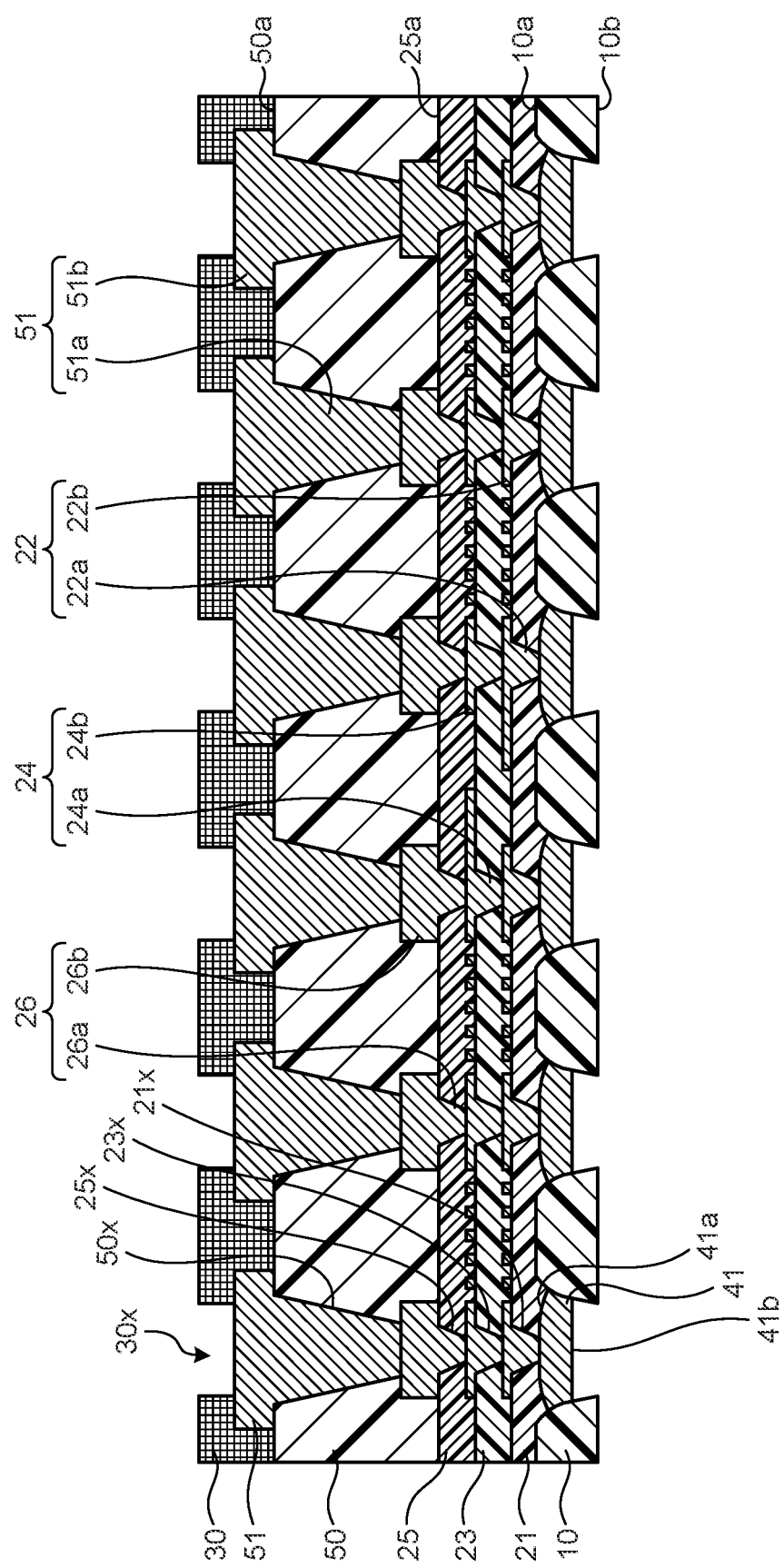
FIG. 19 is a drawing illustrating a specific example of the seed layer removal step of the second embodiment.

Next, as illustrated in FIG. 19, the seed layer 510 is removed by etching, and the lower surface 41b of the pad 41 is exposed along with the lower surface 10b of the insulation layer 10. The removal of the seed layer 510 for example can be performed by dry etching (plasma etching) using etching gas such as CF4. The pad 41 at this time functions as a stopper layer during etching of the seed layer 510.

Next, the lower surface 41b of the pad 41 is retracted (made to recede inward) at the upper surface 10a side more than the lower surface 10b side of the insulation layer 10 by etching the lower surface 41b of the pad 41. A wedge shape is in this way obtained on the lower surface 10b side of the insulation layer 10. In mounting the semiconductor chip, the bump 71 (see FIG. 14) that bonds the pad 41 to the semiconductor chip hangs up on the step (wedge) formed between the lower surface 41b of the pad 41 and the lower surface 10b of the insulation layer 10. The bonding strength of the pad 41 and the semiconductor chip can in this way be improved.

Figure 20:
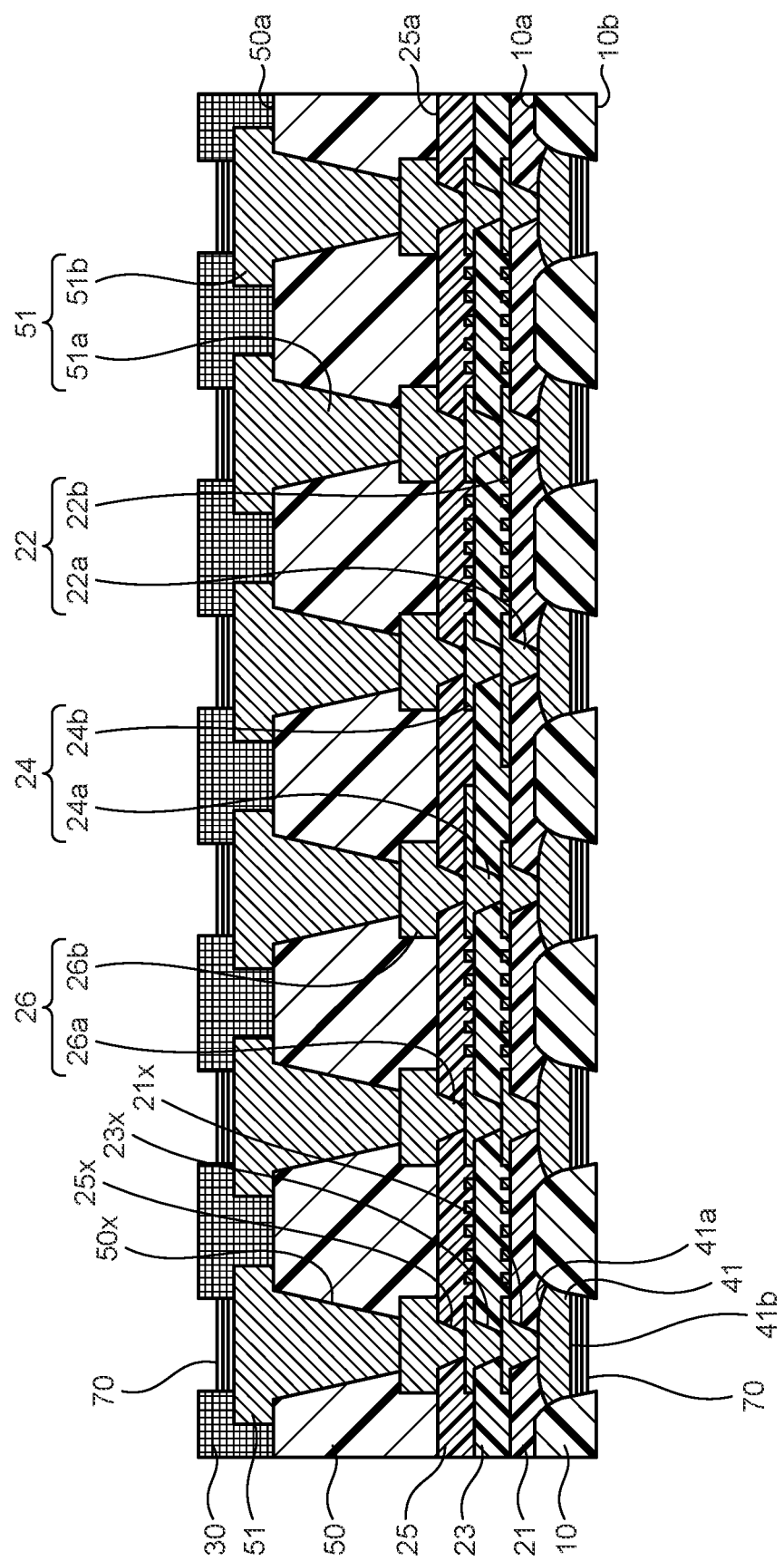
FIG. 20 is a drawing illustrating a specific example of a surface treatment layer forming step of the second embodiment.

Next, as illustrated in FIG. 20, the surface treatment layer 70 is formed on a portion of the wiring pattern 51b of the wiring layer 51 that is exposed from the opening 30x of the solder resist layer 30 and the lower surface 41b of the pad 41. A surface treatment layer is formed on the surface (upper surface and side surface) of the wiring pattern 51b of the wiring layer 51 when not forming a solder resist layer 30.

Figure 21:
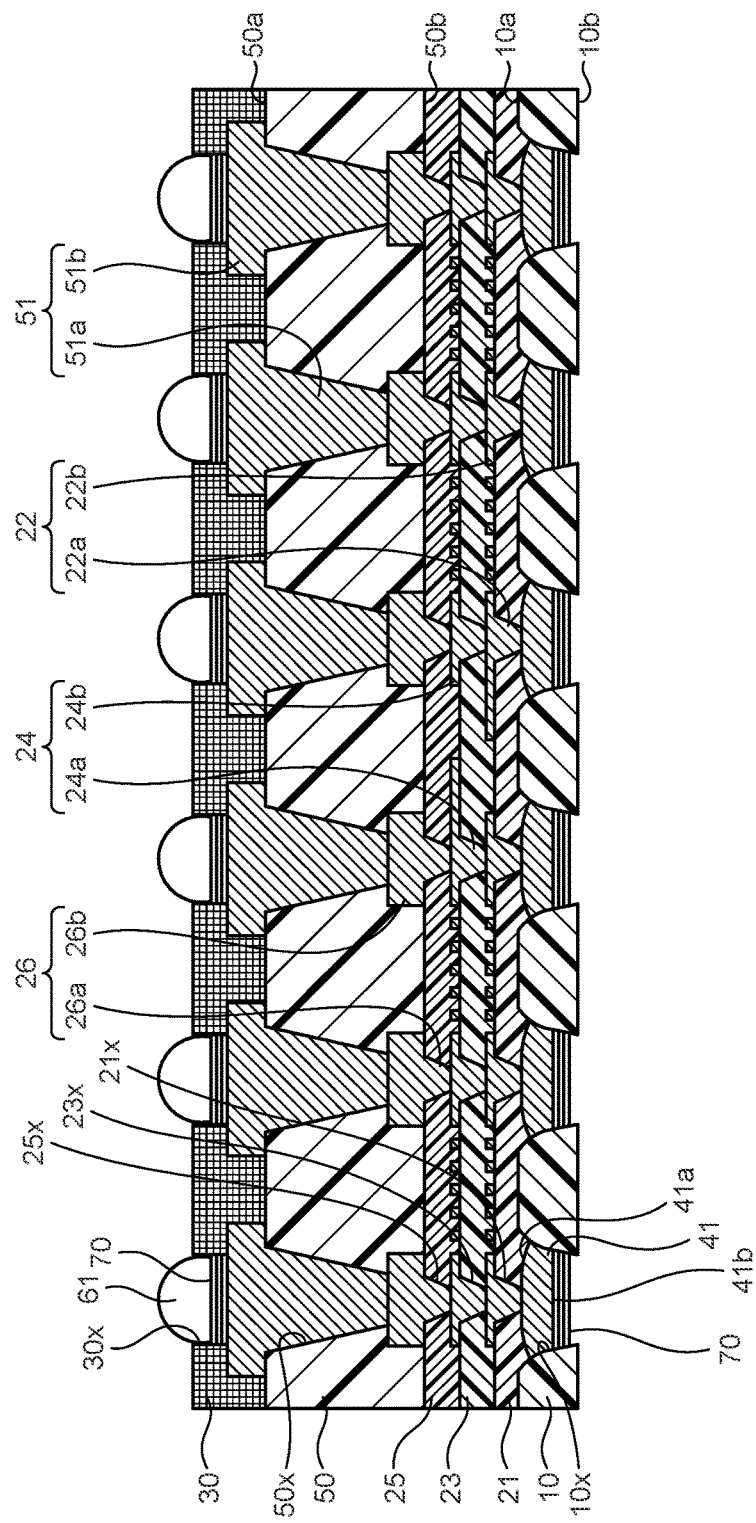
FIG. 21 is a drawing illustrating a specific example of the bump forming step of the second embodiment.

Next, as illustrated in FIG. 21, a bump 61 is formed on the surface treatment layer 70 of the wiring pattern 51b of the wiring layer 51 that is exposed from the opening 30x of the solder resist layer 30. The wiring substrate 1A can therefore be manufactured by the above described manufacturing steps as illustrated in FIG. 13.

Method for Manufacturing Semiconductor Device

The method for manufacturing the semiconductor device 100A of the second embodiment is described next.

The case where utilizing the underfill resin as the adhesion layer 120 (See FIG. 14) is first of all described. The wiring substrate 1A is mounted on the wiring substrate 110. Specifically, the bump 61 is for example heated to be melted and bonded in a state with the wiring substrate 1A pressed against the wiring substrate 110 by utilizing a bonding tool.

Next, the semiconductor chip 130 is mounted on the wiring substrate 1A. Specifically, the solder bump of the semiconductor 130 is for example heated to be melted and bonded in a state with the semiconductor chip 130 pressed against the wiring substrate 1A by utilizing a bonding tool, in the same way as the mounting of the wiring substrate 1A.

Next, along with filling the adhesion layer 120 (underfill resin) between the lower surface of the wiring substrate 1A (lower surface of the solder resist layer 30) and the wiring substrate 110, the underfill resin 131 is filled between the semiconductor chip 130 and the upper surface of the wiring substrate 1A (lower surface 10b of the insulation layer 10). The semiconductor device 100A is obtained in this way.

The case where NCF and ACF are utilized instead of the underfill resin as the adhesion layer 120 is described next. First of all, the adhesion layer 120 is formed on the lower surface of the wiring substrate 1A. (lower surface of the solder resist layer 30).

Next, the wiring substrate 1A is mounted on the wiring substrate 110. Specifically, for example, by heating in a state with the wiring substrate 1A pressed against the wiring substrate 110 by utilizing, the bonding tool, the bump 61 is melted and bonded along with heat curing the resin component of the adhesion layer 120.

Next, the semiconductor chip 130 is mounted on the wiring substrate 1A. Specifically, the solder bump of the semiconductor chip 130 is heated to be melted and bonded in a state with the semiconductor chip 130 pressed against the wiring substrate 1A by utilizing a bonding tool, in the same way as the mounting of the wiring substrate 1A.

Next, the underfill resin 131 is filled between the semiconductor chip 130 and the upper surface of the wiring substrate 1A (lower surface 10b of the insulation layer 10). The semiconductor device 100A is obtained in this way.

In wiring substrate of the second embodiment as described above, the connecting surface of the pad on the side connecting to electronic components such as a semiconductor chip is retracted to a position not reaching the lower surface of the first insulation layer. The bump that bonds the semiconductor chip to the pad therefore hangs up on the step formed between the lower surface of the insulation layer and the end surface of the pad. The bonding strength of the pad and the semiconductor chip can in this way be improved.

The embodiments disclosed above are examples in all respects and should not be construed as limiting the invention. The various aspects of the above described invention allow omissions, substitutions, and modifications not departing from the spirit and scope of the claims.

Regarding the above embodiments, the following notes are also disclosed.

(Note 1) A method for manufacturing a wiring substrate, the method comprising:

forming a seed layer and a first insulation layer containing insulating resin in sequence on a support member;

patterning the first insulation layer, and forming a through hole with an inner wall surface that has a curved surface curving and protruding toward interior of an opening of the through hole; and forming a pad that includes a curved surface curving in a protruding shape within the through hole.

(Note 2) The method for manufacturing a wiring substrate according to Note 1, further comprising:

forming a second insulation layer containing insulating resin on a first surface of the first insulation layer so as to cover the pad; and forming a first wiring layer including a first via wiring that passes through the second insulation layer thickness direction and a first wiring pattern formed on a first surface of the second insulation layer, on the second insulation layer, wherein the curved surface curving the protruding shape the pad is connected to the first via wiring of the first wiring layer.

(Note 3) The method for manufacturing a wiring substrate according to Note 2, further comprising:

laminating a plurality of insulation layers and a plurality of wiring layers alternately on the second insulation layer;

peeling the support member from the seed layer;

removing the seed layer, and exposing a second surface on a side opposite the first surface of first insulation layer and a first surface on a side opposite a connecting surface of the pad that connects to the first wiring layer;

forming a protective layer that is formed with an opening exposing a portion of the first surface of the pad, on the second surface of the first insulation layer; and forming a bump on the first surface of the pad that is exposed from the opening of the protective layer.

(Note 4) The method for manufacturing a wiring substrate according to Note 2, further comprising:

laminating a plurality of insulation layers and a plurality of wiring layers alternately on the second insulation layer;

peeling the support member from the seed layer;

removing the seed layer, and exposing a second surface on a side opposite the first surface of the first insulation layer and a first surface on a side opposite a connecting surface of the pad that connects to the first wiring layer; and etching the first surface of the pad, and retracting the first surface of the pad at the first surface side of the first insulation layer rather than the second surface of the first insulation layer.

(Note 5) The method for manufacturing a wiring substrate according to Note 4, further comprising:

forming a third insulation layer that is formed with a through hole exposing a portion of the wiring layer at a position on an uppermost layer among the wiring layers;

forming a second wiring layer that connects to the wiring layer at the position on the uppermost layer by way of the through hole of the third insulation layer, on the third insulation layer; and forming a protective layer that is formed with an opening exposing a portion of the second layer, on the third insulation layer.

One aspect of the wiring substrate disclosed on this application renders the effect of improving the connection reliability between the pad and via wiring and also suppresses the occurrence of cracks in the insulation layer.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A wiring substrate comprising:
   a first insulation layer that contains insulating resin;
   a first through hole that passes through the first insulation layer in a thickness direction;
   a pad that is formed in the first through hole;
   a second insulation layer that is laminated on a first surface of the first insulation layer and contains insulating resin; and
   a first wiring layer that is provided on the second insulation layer and connected to the pad, wherein
   a connecting surface of the pad that connects to the first wiring layer includes a curved surface curving in a protruding shape toward the first surface of the first insulation layer,
   an inner wall surface of the first through hole includes a curved surface that curves and protrudes toward interior of an opening of the first through hole, and
   an outer end of the connecting surface of the pad contacts the inner wall surface of the first through hole at a position lower than the first surface of the first insulation layer.

2. The wiring substrate according to claim 1, wherein the second insulation layer is formed so as to enter inside the opening of the first through hole.

3. The wiring substrate according to claim 1, wherein the first insulation layer is thicker than the second insulation layer.

4. The wiring substrate according to claim 1, wherein a surface on a side opposite the connecting surface of the pad is recessed from a second surface of the first insulation layer toward the first surface side of the first insulation layer, the second surface of the first insulation layer being on a side opposite the first surface of the first insulation layer.

* * * * *